United States Patent
Shen et al.

(10) Patent No.: US 12,074,110 B2
(45) Date of Patent: Aug. 27, 2024

(54) METHOD FOR MANUFACTURING SEMICONDUCTOR DEVICE

(71) Applicant: TAIWAN SEMICONDUCTOR MANUFACTURING COMPANY LTD., Hsinchu (TW)

(72) Inventors: Ching-Kai Shen, Hsinchu County (TW); Yi-Chuan Teng, Hsinchu County (TW); Wei-Chu Lin, Hsinchu (TW); Hung-Wei Liang, New Taipei (TW); Jung-Kuo Tu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 204 days.

(21) Appl. No.: 17/815,242

(22) Filed: Jul. 27, 2022

(65) Prior Publication Data
US 2022/0367378 A1 Nov. 17, 2022

Related U.S. Application Data

(62) Division of application No. 16/426,543, filed on May 30, 2019, now Pat. No. 11,462,478.

(51) Int. Cl.
| H01L 23/532 | (2006.01) |
| H01L 21/768 | (2006.01) |
| H01L 23/31 | (2006.01) |
| H01L 23/34 | (2006.01) |
| H01L 23/48 | (2006.01) |

(52) U.S. Cl.
CPC .. *H01L 23/53295* (2013.01); *H01L 21/76898* (2013.01); *H01L 23/3171* (2013.01); *H01L 23/34* (2013.01); *H01L 23/481* (2013.01)

(58) Field of Classification Search
CPC ........... H01L 23/53295; H01L 23/3171; H01L 23/34; H01L 23/481; H01L 21/76898
USPC ......................................................... 257/734
See application file for complete search history.

(56) References Cited

U.S. PATENT DOCUMENTS

| 6,635,509 | B1* | 10/2003 | Ouellet | B81C 1/00333 438/106 |
| 7,491,567 | B2* | 2/2009 | DCamp | B81C 1/00285 257/415 |
| 7,863,071 | B1* | 1/2011 | Ivanov | B81C 1/00246 438/53 |
| 8,148,790 | B2* | 4/2012 | Morris, III | B81C 1/00333 257/E21.705 |
| 9,567,208 | B1* | 2/2017 | Cheng | B81B 3/0005 |
| 9,926,190 | B2* | 3/2018 | Chang | B81B 7/02 |

(Continued)

*Primary Examiner* — Eric W Jones
(74) *Attorney, Agent, or Firm* — WPAT LAW; Anthony King

(57) ABSTRACT

A method for forming a semiconductor device includes receiving a first bonded to a second substrate by a dielectric layer, wherein a conductive layer is disposed in the dielectric layer and a cavity is formed between the first substrate, the second substrate and the dielectric layer; forming a via opening in the second substrate to expose the conductive layer and a vent hole in the substrate to couple to the cavity; forming a first buffer layer covering sidewalls of the via opening and a second buffer layer covering sidewalls of the vent hole; and forming a connecting structure in the via opening and a sealing structure to seal the vent hole.

20 Claims, 20 Drawing Sheets

(56) References Cited

U.S. PATENT DOCUMENTS

| | | | |
|---|---|---|---|
| 2004/0248344 A1* | 12/2004 | Partridge | B81C 1/00301 438/127 |
| 2005/0052724 A1* | 3/2005 | Suzuki | G01H 9/00 359/305 |
| 2005/0054133 A1* | 3/2005 | Felton | G01P 15/0802 29/595 |
| 2005/0085016 A1* | 4/2005 | McWilliams | H03H 9/0585 438/114 |
| 2006/0205106 A1* | 9/2006 | Fukuda | B81C 1/00246 438/52 |
| 2007/0190680 A1* | 8/2007 | Fukuda | B81C 1/0023 438/50 |
| 2007/0224832 A1* | 9/2007 | Zurcher | B81C 1/00253 438/758 |
| 2009/0108381 A1* | 4/2009 | Buchwalter | H03H 9/2405 333/186 |
| 2009/0134513 A1* | 5/2009 | Qiu | B81C 1/00095 257/734 |
| 2010/0285628 A1* | 11/2010 | Martin | H04R 3/00 257/E21.002 |
| 2011/0163399 A1* | 7/2011 | Witvrouw | B81C 1/00293 257/419 |
| 2012/0025389 A1* | 2/2012 | Chu | B81C 1/00269 257/773 |
| 2012/0098122 A1* | 4/2012 | Yang | H01L 21/76 257/E23.161 |
| 2012/0142144 A1* | 6/2012 | Taheri | B81C 1/0023 438/107 |
| 2013/0193527 A1* | 8/2013 | Chu | H01L 21/76898 257/E27.009 |
| 2014/0191341 A1* | 7/2014 | Chu | B81B 7/0038 257/415 |
| 2014/0264648 A1* | 9/2014 | Chu | B81B 7/04 257/415 |
| 2014/0264653 A1* | 9/2014 | Cheng | B81C 1/00238 257/416 |
| 2014/0264662 A1* | 9/2014 | Cheng | B81B 7/02 257/419 |
| 2015/0097215 A1* | 4/2015 | Chu | B81C 1/00277 438/51 |
| 2015/0175407 A1* | 6/2015 | Cheng | B81C 1/00246 438/51 |
| 2015/0329353 A1* | 11/2015 | Cheng | B81B 7/0077 438/51 |
| 2016/0119722 A1* | 4/2016 | Chu | H04R 31/006 438/51 |
| 2016/0362296 A1* | 12/2016 | Lee | H01L 23/5226 |

* cited by examiner

METHOD FOR MANUFACTURING SEMICONDUCTOR DEVICE

PRIORITY DATA

This patent is a divisional application of U.S. patent application Ser. No. 16/426,543 filed on May 30, 2019, entitled of "LAYER FOR BUFFER SEMICONDUCTOR STRUCTURE INCLUDING MICROELECTROMECHANICAL SYSTEM (MEMS) DEVICE", the entire disclosure of which is hereby incorporated by reference.

BACKGROUND

The semiconductor industry has experienced rapid growth due to in part ongoing improvements in the integration density of a variety of electronic components e.g., transistors, diodes, resistors, capacitors, etc.). For the most part, improvement in integration density has resulted from iterative reduction of minimum feature size, which allows more components to be integrated. For example, microelectromechanical system (MEMS) devices, which are microscopic devices that integrate mechanical and electrical components to sense physical quantities and/or to act upon surrounding environment, are integrated in a package structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
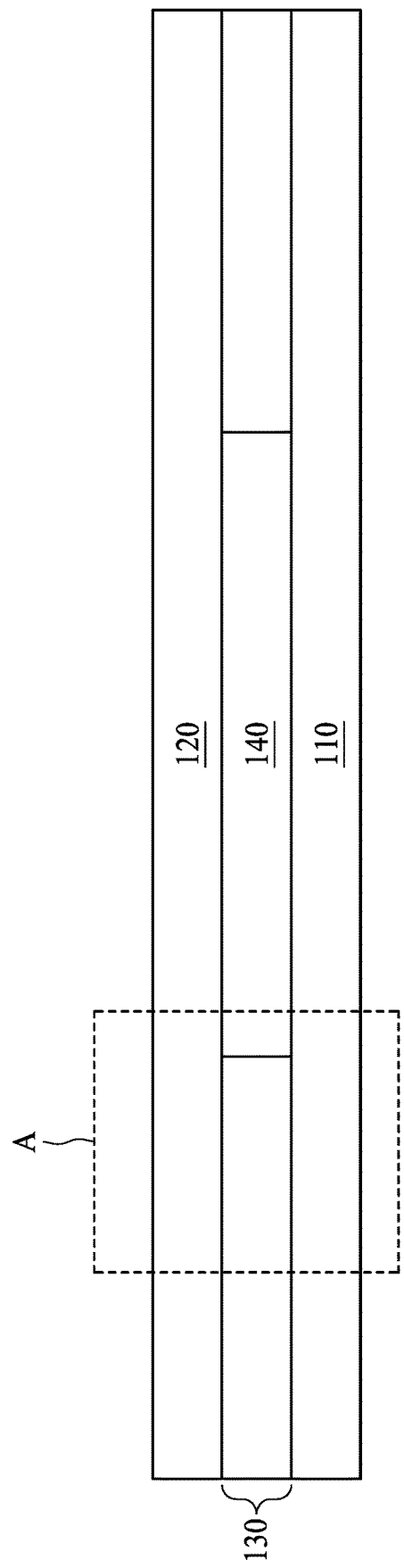
FIG. 1 is a schematic drawing illustrating a semiconductor device in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

One or more implementations of the present disclosure will now be described with reference to the attached drawings, wherein like reference numerals are used to refer to like elements throughout, and wherein the illustrated structures are not necessarily drawn to scale. As used herein, the terms "die" and "chip" are interchangeable throughout the specification.

The terms "wafer" and "substrate" used herein include any structure having an exposed surface onto which a layer is deposited according to the present invention, for example, to form the circuit structure such as a redistribution layer (RDL). The term substrate is understood to include semiconductor wafers, but is not limited thereto. The term substrate is also used to refer to semiconductor structures during processing, and may include other layers that have been fabricated thereupon.

A semiconductor device is manufactured by a number of operations. In some applications, an electrical interconnection structure is formed between at least two semiconductor chips in the semiconductor device in order to provide electrical connection. In some embodiments, a trench or a via opening can be formed to penetrate from one of the semiconductor chips, through one or more dielectric layers disposed between the two semiconductor chips and to the other semiconductor chip. A conductive pad disposed in the dielectric layer may be exposed through the trench or the via opening. The trench or the via opening is then coated or filled with a conductive material, so that the conductive metallic structures are electrically connected across the semiconductor chips through the trench coated or filled with the conductive material.

In some comparative embodiments, a crack may be formed in the dielectric layer disposed between the two semiconductor chips due to the different coefficients of thermal extension (CTEs) between the conductive material and the dielectric material. The CTE mismatch generates thermal stress on the dielectric layer, and thus the crack is caused. In some comparative embodiments, the trench or via opening may have a lower portion exposing the conductive pad and an upper portion over the lower portion. In some comparative embodiments, the upper portion has a width greater than the lower portion, and thus a portion of the dielectric layer may be exposed through a bottom of the upper portion and exposed through a sidewall of the lower portion. In some comparative embodiments, the thermal stress is a tensile stress, which causes the cracks in the dielectric layer. In some comparative embodiments, a dielectric corner may be formed by the dielectric layer exposed through the bottom of the upper portion and exposed through the sidewall of the lower portion. Significantly, the dielectric corner encounters more thermal stress and thus the crack issue is more serious at the dielectric corner.

The embodiments of the present disclosure therefore provide a method for forming a semiconductor device to form a buffer layer to cover the dielectric corner or to cover exposed surfaces of the dielectric layer. The buffer layer may generate a compressive stress that is opposite to the tensile stress from the conductive material. Consequently, the tensile stress may be balanced by the buffer layer, and thus the crack issue in the dielectric layer may be mitigated.

FIG. 1 is a schematic drawing illustrating a semiconductor device in accordance with some embodiments of the present disclosure. In some embodiments, the semiconductor device 100 can include MEMS devices integrated with complementary metal-oxide-semiconductor (CMOS) devices. In some embodiments, the semiconductor device 100 can include a first substrate 110 and a second substrate 120 bonded to each other. In some embodiments, the first substrate 110 can be a CMOS substrate (or a circuit substrate) and the second substrate 120 can be MEMS substrate, but the disclosure is not limited thereto. In some embodiments, an interconnection structure 130 is disposed over the first substrate 110, and the second substrate 120 is bonded to the first substrate 110 through the interconnection structure 130. In some embodiments, a cavity 140 can be formed between the first substrate 110, the second substrate 120 and the interconnection structure 130, but the disclosure is not limited thereto. In some embodiments, a portion of the first surface 120a of the second substrate 120, a portion of the second buffer layer 162, a portion of the dielectric layer 132 and a portion of the first substrate 110 are exposed through the cavity 140.

The first substrate 110 may be any substrate including integrated circuit (IC) devices formed on a side, which can be referred to as an active side. The IC devices may be formed using CMOS process and/or other suitable semiconductor device fabrication processes. In some embodiments, the first substrate 110 can include a bonding structure over a side opposite to the active side. The second substrate 120 may include MEMS devices, and the MEMS devices include very small electrical/mechanical devices, such as sensors, actuators, mirrors, gyroscopes, accelerometers or the like. The interconnection structure 130 may include a dielectric layer 132 (shown in FIGS. 2-6) and contacts/vias and conductive layer 134 (shown in FIGS. 2-6) disposed in the dielectric layer 132. The interconnection structure 130 (including the dielectric layer 132 and the contacts/vias and conductive layer 134) are disposed between the first substrate 110 and the second substrate 120. In some embodiments, the conductive layer 134 is electrically coupled to the devices formed in the first substrate 110 through the contacts/vias.

Figure 2:
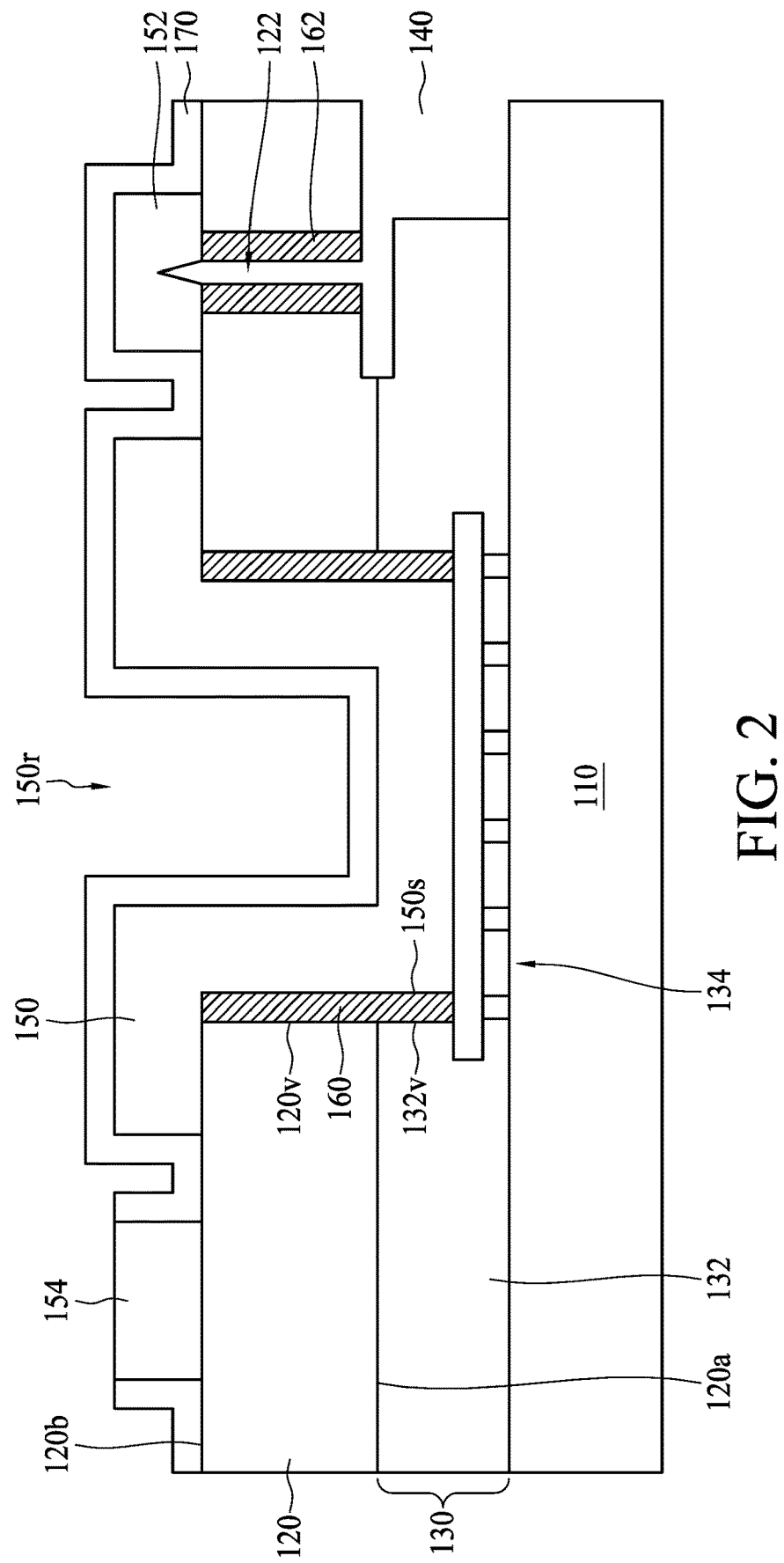
FIG. 2 is a partial schematic drawing illustrating a semiconductor device in accordance with some embodiments of the present disclosure.

Please refer to FIG. 2, which is a partial schematic drawing illustrating a semiconductor device in accordance with some embodiments of the present disclosure. In some embodiments, FIG. 2 is an enlarged partial view of a portion A of the semiconductor device 100, as shown in the dotted frame in FIG. 1, but the disclosure is not limited thereto. As shown in FIG. 2, the second substrate 120 has a first surface 120a facing the first substrate 110 and a second surface 120b opposite to the first surface 120a. In some embodiments, the first surface 120a of the second substrate 120 is the surface bonded to and in contact with the dielectric layer 132 of the interconnection structure 130. As shown in FIG. 2, in some embodiments, a vent hole 122 is formed in the second substrate 120. Further, the vent hole 122 penetrates the second substrate 120 from the second surface 120b to the first surface 120a, and thus the vent hole 122 is coupled to the cavity 140. As shown in FIG. 2, a portion of the first surface 120a of the second substrate 120, a portion of the second buffer layer 162, a portion of the dielectric layer 132 and a portion of the first substrate 110 are exposed through the cavity 140.

In some embodiments, the semiconductor device 100 further includes a connecting structure 150 disposed in the second substrate 120 and penetrating the second substrate 120 from the second surface 120b to the first surface 120a. Further, the connecting structure 150 penetrates a portion of the dielectric layer 132. As shown in FIG. 2, the connecting structure 150 is electrically coupled to the conductive layer 134. In some embodiments, the connecting structure 150 can cover a portion of the second surface 120b of the second substrate 120, but the disclosure is not limited thereto. In some embodiments, the connecting structure 150 includes a recessed portion 150r, but the disclosure is not limited thereto. In some embodiments, the semiconductor device 100 further includes a sealing structure 152 disposed over the second surface 120b of the second substrate 120. The sealing structure 152 may include a seam due to metal grain growth, but the disclosure is not limited thereto. Significantly, the cavity 140 is sealed by the sealing structure 152 from the second surface 120b of the second substrate 120. In some embodiments, the semiconductor device 100 further includes a bonding structure 154 disposed over the second surface 120b of the second substrate 120. The bonding structure 154 can serve as a terminal for an external electrical connection, but the disclosure is not limited thereto. In some embodiments, the connecting structure 150, the sealing structure 152 and the bonding structure 154 include a same material such as aluminum (Al), copper (Cu) or the like. In some embodiments, a thickness of the connecting structure 150, the sealing structure 152 and the bonding structure 154 are substantially the same as each other, but the disclosure is not limited thereto. For example, the thickness of the connecting structure 150, the sealing structure 152 and the bonding structure 154 can be between approximately 3 μm and approximately 10 μm, but the disclosure is not limited thereto.

In some embodiments, the connecting structure 150, the sealing structure 152 and the bonding structure 154 are separated from each other, as shown in FIG. 2. In some embodiments, the connecting structure 150 can be coupled to the sealing structure 152, while the coupled connecting structure 150 and sealing structure 152 are separated from the bonding structure 154, though not shown. In other embodiments, the connecting structure 150 can be coupled to the bonding structure 154, while the connecting structure 150 and the bonding structure 154 are separated from the sealing structure 152, though not shown.

Still referring to FIG. 2, the semiconductor device 100 further includes a first buffer layer 160 disposed between the connecting structure 150 and the second substrate 120, and between the connection structure 150 and the dielectric layer 132. Further, the semiconductor device 100 can include a second buffer layer 162 covering sidewalls of the vent hole 122, as shown in FIG. 2. The first buffer layer 160 and the second buffer layer 162 can include a same material, but the disclosure is not limited thereto. In some embodiments, the first buffer layer 160 and the second buffer layer 162 can include silicon oxide (SiO), silicon nitride (SiN) or silicon oxynitnde (SiON), but the disclosure is not limited thereto. In some embodiments, the first buffer layer 160 and the second buffer layer 162 have a same thickness, but the disclosure is not limited thereto. In some embodiments, the thickness of the first buffer layer 160 and the second buffer layer 162 is between approximately 0.5 μm and approximately 2 μm, but the disclosure is not limited thereto.

In some embodiments, the semiconductor device 100 further includes a dielectric layer 170 disposed over the second surface 120b of the second substrate 120, the connecting structure 150 and the sealing structure 152. In some embodiments, the dielectric layer 170 covers an exterior surface of the connecting structure 150 and an exterior surface of the sealing structure 152. However, the bonding structure 154 is exposed through the dielectric layer 170 for providing external connection.

In some embodiments, the second substrate 120 has a vertical surface 120v facing a sidewall 150s of the connecting structure 150, and the dielectric layer 132 has a vertical surface 132v facing the sidewall 150s of the connecting structure 150. Further, the vertical surface 120v of the second substrate 120 and the vertical surface 132v of the dielectric layer 132 are coupled to form a straight line, as shown in FIG. 2. Significantly, the first buffer layer 160 is in contact with the vertical surface 120v of the second substrate 120 and the vertical surface 132v of the dielectric layer 132.

Figure 3:
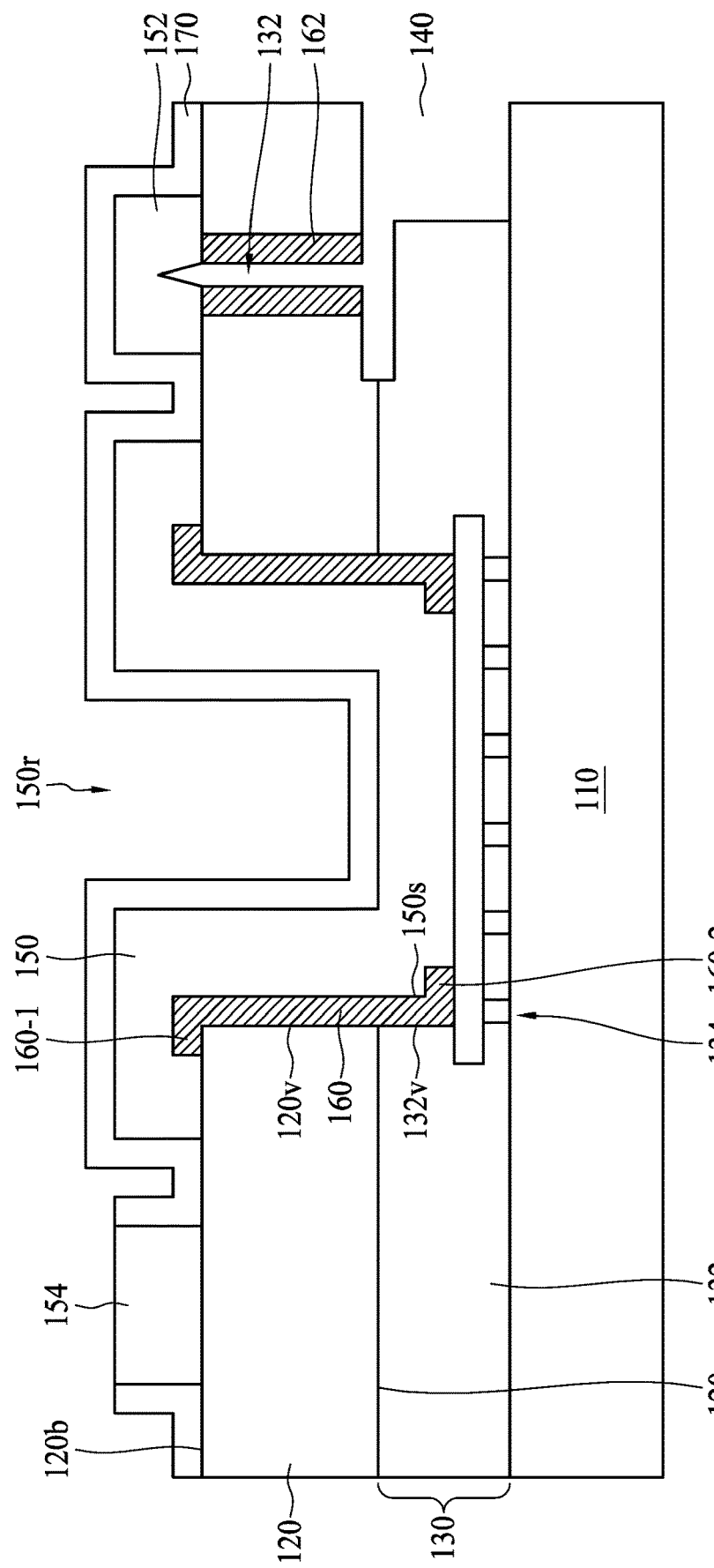
FIG. 3 is a partial schematic drawing illustrating a semiconductor device in accordance with some embodiments of the present disclosure.

Please refer to FIG. 3, which is a partial schematic drawing illustrating a semiconductor device in accordance with some embodiments of the present disclosure. In some embodiments, FIG. 3 is an enlarged partial view of a portion A of the semiconductor device 100, as shown in the dotted frame in FIG. 1, but the disclosure is not limited thereto. Referring to FIG. 3, in some embodiments, the first buffer layer 160 further include a portion 160h-1 covering a portion of the second surface 120b of the second substrate 120 and a portion 160h-2 covering a portion of the conductive layer 134. In such embodiments, surfaces of both the portion 160h-1 and the portion 160h-2 can be parallel with the second surface 120b of the second substrate 120, but the disclosure is not limited thereto.

Figure 4:
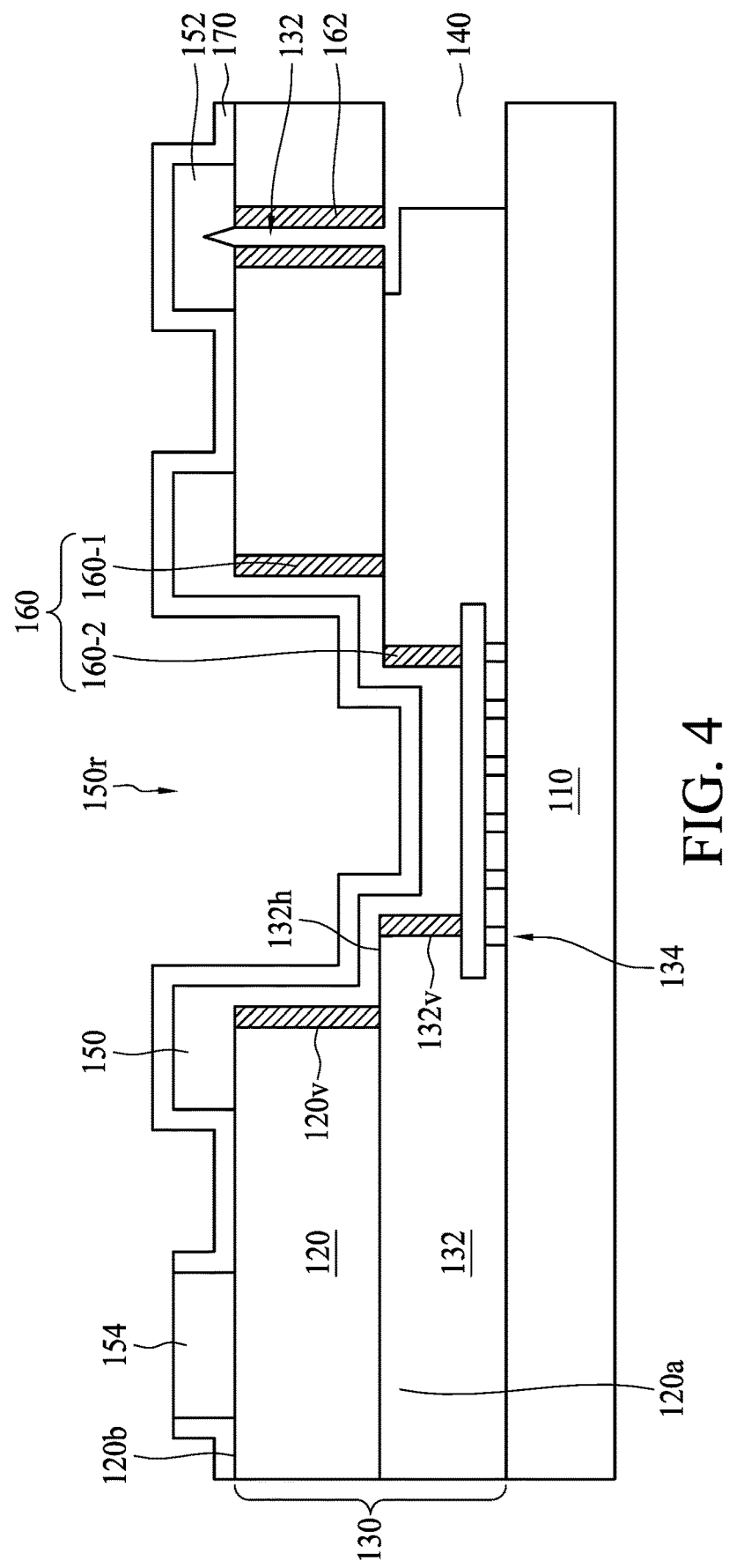
FIG. 4 is a partial schematic drawing illustrating a semiconductor device in accordance with some embodiments of the present disclosure.

Please refer to FIG. 4, which is a partial schematic drawing illustrating a semiconductor device in accordance with some embodiments of the present disclosure. In some embodiments, FIG. 4 is an enlarged partial view of a portion A of the semiconductor device 100, as shown in the dotted frame in FIG. 1, but the disclosure is not limited thereto. Referring to FIG. 4, in some embodiments, the vertical surface 120v of the second substrate 120 and the vertical surface 132v of the dielectric layer 132 are separated from a horizontal surface 132h of the dielectric layer 132. In some embodiments, the horizontal surface 132h of the dielectric layer 132 may be parallel with the first surface 120a or the second surface 120h of the second substrate 120, but the disclosure is not limited thereto. In some embodiments, the vertical surface 120v of the second substrate 120, the horizontal surface 132h of the dielectric layer 132 and the vertical surface 132v of the dielectric layer 132 may form a staggered configuration, as shown in FIG. 3, but the disclosure is not limited thereto. In such embodiments, the first buffer layer 150 further includes a first portion 160-1 covering a portion of the vertical surface 120v of the second substrate 120, and a second portion 160-2 covering the vertical surface 132v of the dielectric layer 132. Further, the first buffer layer 160 is absent from the horizontal surface 132h of the dielectric layer 132. In other words, the first portion 160-1 and the second portion 106-2 of the first buffering layer 160 are separated from each other 1w the horizontal surface 132h of the dielectric layer 132.

Figure 5:
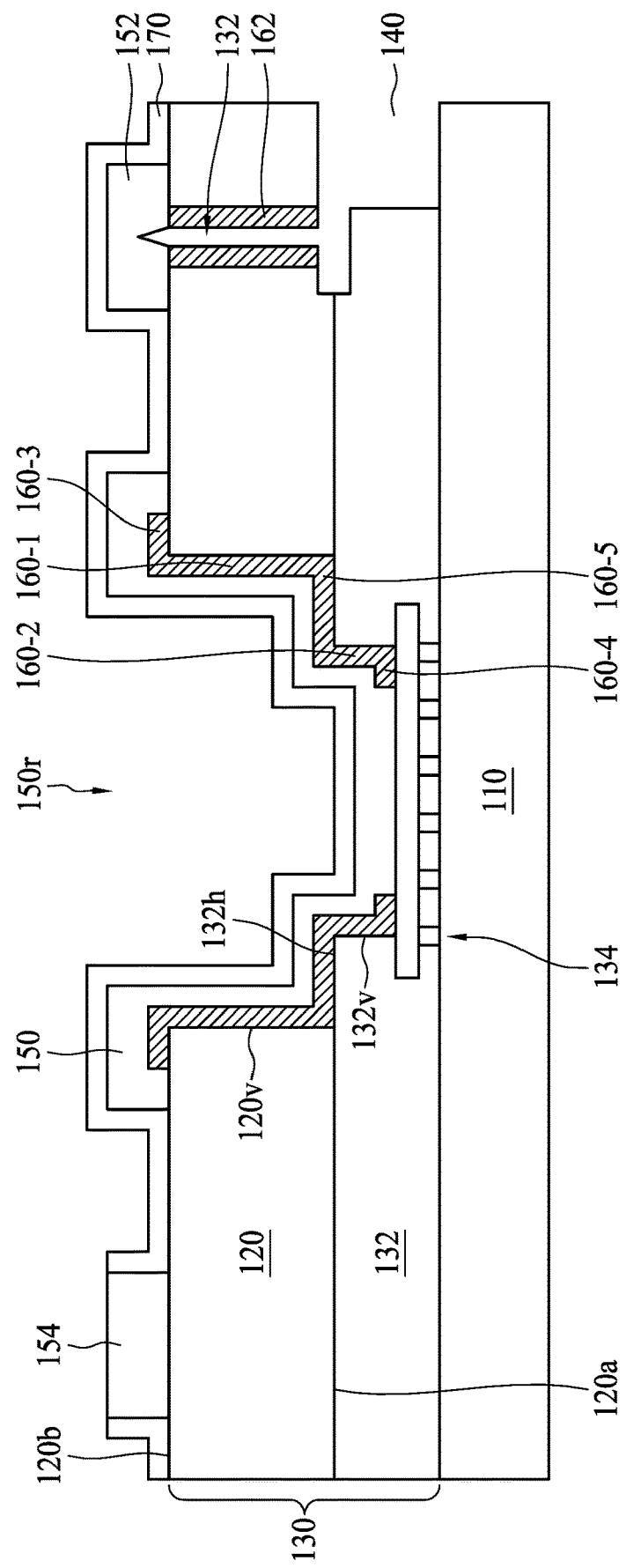
FIG. 5 is a partial schematic drawing illustrating a semiconductor device in accordance with some embodiments of the present disclosure.

FIG. 5 is a partial schematic drawing illustrating a semiconductor device in accordance with some embodiments of the present disclosure. In some embodiments, FIG. 5 is an enlarged partial view of a portion A of the semiconductor device 100, as shown in the dotted frame in FIG. 1, but the disclosure is not limited thereto. Referring to FIG. 5, in some embodiments, the first buffer layer 150 further includes a first portion 160-1 covering a portion of the vertical surface 120v of the second substrate 120, a second portion 160-2 covering the vertical surface 132v of the dielectric layer 132, a third portion 160-3 covering a portion of the second surface 120b of the second substrate 120, a fourth portion 160-4 coveting a portion of the conductive layer 134 and a fifth portion 160-5 covering the horizontal surface 132h of the dielectric layer 132. As shown in FIG. 5, the first portion 160-1, the second portion 160-2, the third portion 160-3, the fourth portion 160-4 and the fifth portion 160-5 are coupled to each other, and a staggered shape is formed by the portions 160-1 to 160-5. Further, the first buffer layer 160 is conformally disposed over the second, substrate 120, the dielectric layer 132 and the conductive layer 134, as shown in FIG. 5.

Figure 6:
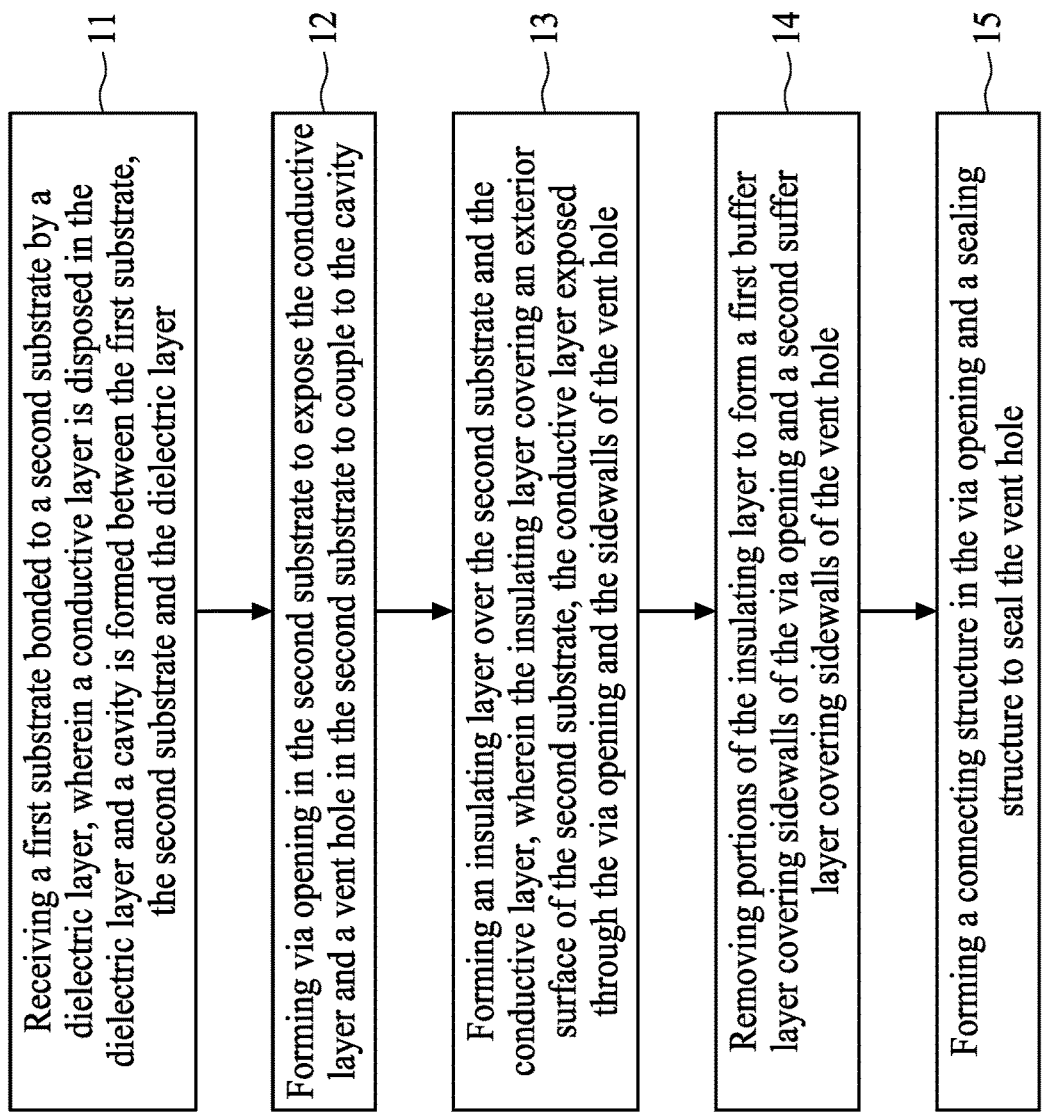
FIG. 6 is a flow diagram representing a method for manufacturing a semiconductor device in accordance with some embodiments of the present disclosure.

FIG. 6 is a flow diagram representing a method for manufacturing a semiconductor device in accordance with some embodiments of the present disclosure, and FIGS. 7A through 7I illustrate partial sectional views of a semiconductor device at various fabrication stages constructed according to aspects of the present disclosure in one or more embodiments. In some embodiments, a method of firming a semiconductor device 10 is provided. The method 10 includes a number of operations (11, 12, 13, 14 and 15). Significantly, although FIGS. 7A through 7I illustrate the portion A shown in FIG. 1, the remaining portions of the semiconductor device can be easily understood according to the method for manufacturing the semiconductor device in accordance with some embodiments of the present disclosure.

Figure 7A:
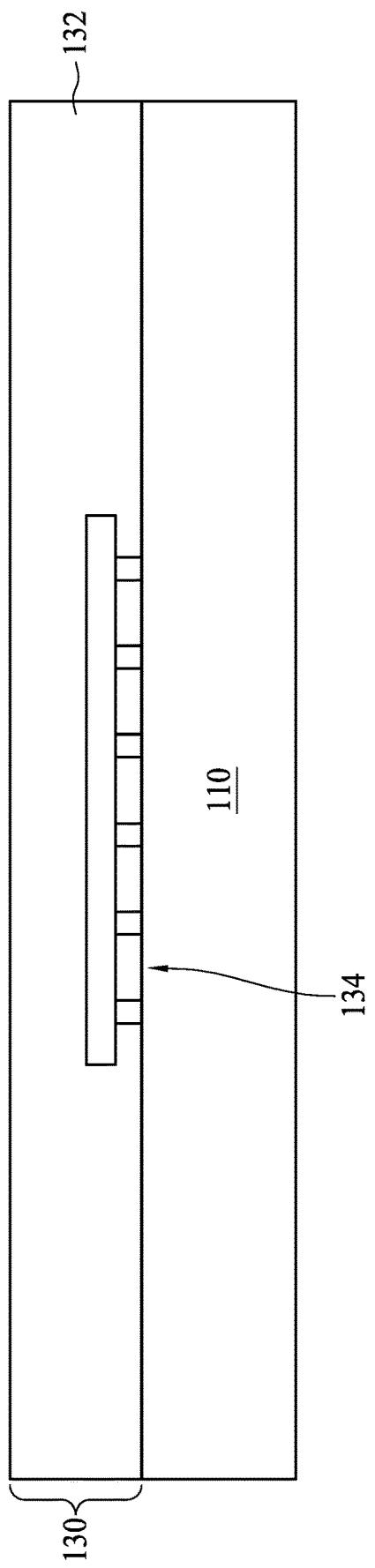
FIGS. 7A through 7I illustrate sectional views of a semiconductor device at various fabrication stages constructed according to aspects of the present disclosure in one or more embodiments.

Referring to FIG. 7A, a first substrate 110 is provided or received in operation 11. The first substrate 110 may include a semiconductor substrate having a plurality of semiconductor devices formed therein, and the plurality of semiconductor devices may include, for example, CMOS devices or other types of semiconductor devices. As mentioned above, the plurality of semiconductor devices is formed over a surface of the first substrate 110, and the surface can therefore be referred to as an active surface. Still referring to FIG. 7A, an interconnection structure 130 can be formed over the active surface of the first substrate 110. The interconnection structure 130 may include a dielectric layer 132 and a plurality of contacts vias and conductive layer 134 disposed in the dielectric layer 132. For clarity, only a topmost conductive layer 134 is shown in FIG. 7A.

Figure 7B:
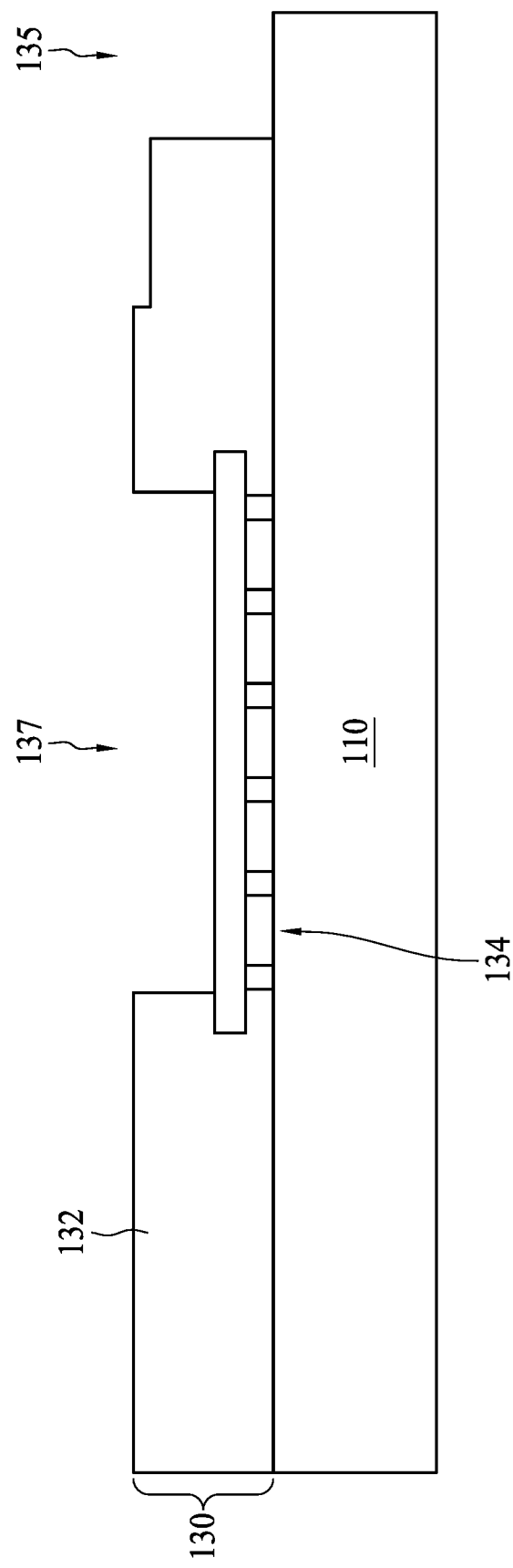

Referring to FIG. 7B, in some embodiments, an etching operation can be performed on the dielectric layer 132 of the interconnection structure 130. Accordingly, an opening 135 is formed in the dielectric layer 132 of the interconnection structure 130. In some embodiments, the etching operation simultaneously forms an opening 137 in the dielectric layer 132. However, in other embodiments, the opening 137 can be formed prior to or after the forming of the opening 135. Significantly, a portion of the first substrate 110 and a portion of the dielectric layer 132 are exposed through the opening 135, and a portion of the conductive layer 134 is exposed through the opening 137. As shown in FIG. 7B, the first substrate 110 serves as a bottom surface of the opening 135, and the dielectric layer 132 serves as sidewalls of the opening 135. The conductive layer 134 serves as a bottom surface of the opening 137, and the dielectric layer 132 serves as sidewalk of the opening 137.

Figure 7C:
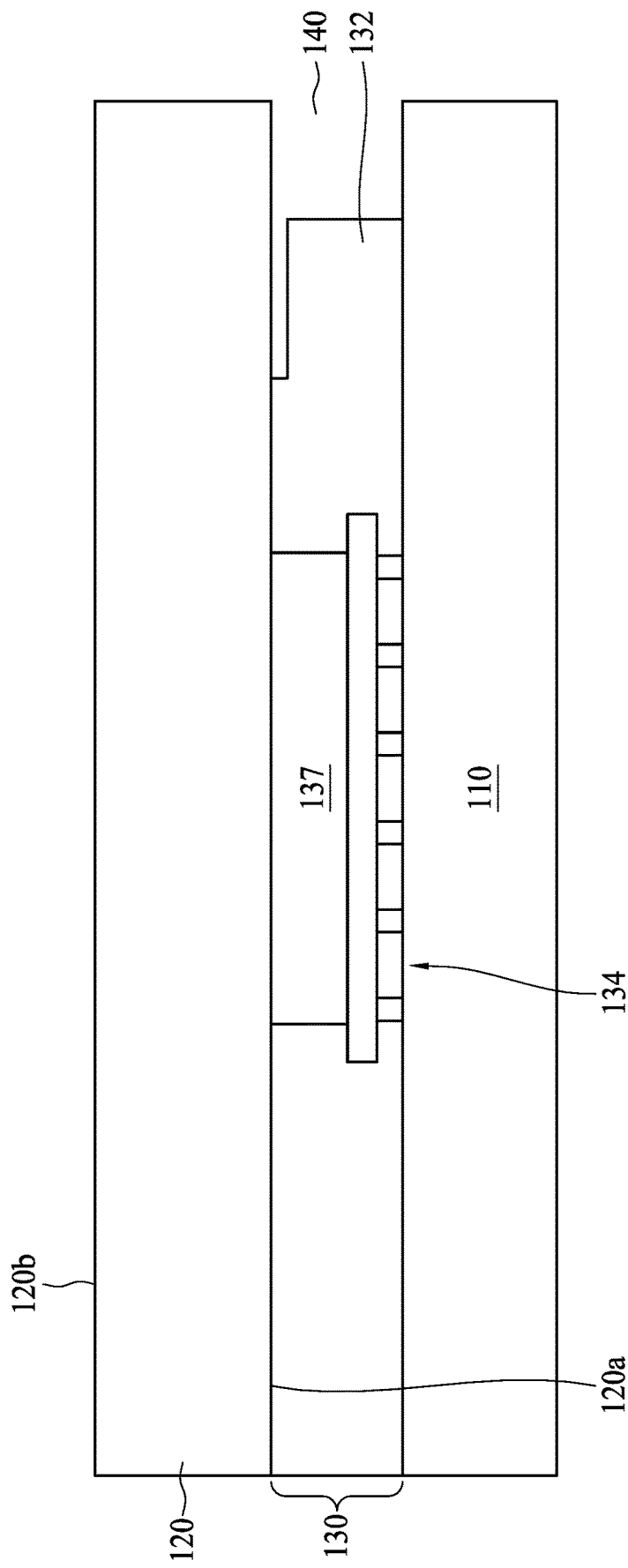

Referring to FIG. 7C, in operation 11, a second substrate 120 is arranged over and bonded to the first substrate 110 by the dielectric layer 132 of the interconnection structure 130. In some embodiments, the bonding of the second substrate 120 and the dielectric layer 132 can include fusion bonding, but the disclosure is not limited thereto. As shown in FIG. 7C, the second substrate 120 includes a first surface 120a facing the first substrate 110 and a second surface 120b opposite to the first surface 120a. Additionally, the second surface 120b can be referred to as an exterior surface, but the disclosure is not limited thereto. Significantly, the bonding of the second substrate 120 and the first substrate 110 seals the opening 135, and thus a cavity 140 is formed in between the first substrate 110, the dielectric layer 132 and the second substrate 120. In other words, the cavity 140 is hermetically sealed with the first substrate 110 serving as a bottom surface, the first surface 120a of the second substrate 120 serving as a top surface and the dielectric layer 132 serves as sidewalls. In some embodiments, the cavity 140 is in vacuum, but the disclosure is not limited thereto. In some embodiments, a thickness of the second substrate 120 can be reduced if required. The thickness reduction of the second substrate 120 can be achieved by a chemical mechanical polishing (CMP) operation, but the disclosure is not limited thereto. As mentioned above, the second substrate 120 can include MEMS devices formed therein, but the disclosure is not limited thereto. Additionally, in some embodiments, the MEMS devices can be formed in the second substrate 120 before the bonding of the second substrate 120 to the first substrate 110. In other embodiments, the MEMS devices can be formed in the second substrate 120 after the bonding of the second substrate 120 to the first substrate 110, but before the thickness reduction of the second substrate 120. In yet other embodiments, the MEMS devices can be formed in the second substrate 120 after the bonding of the second substrate 120 to the first substrate 110 and the thickness reduction of the second substrate 120.

Figure 7D:
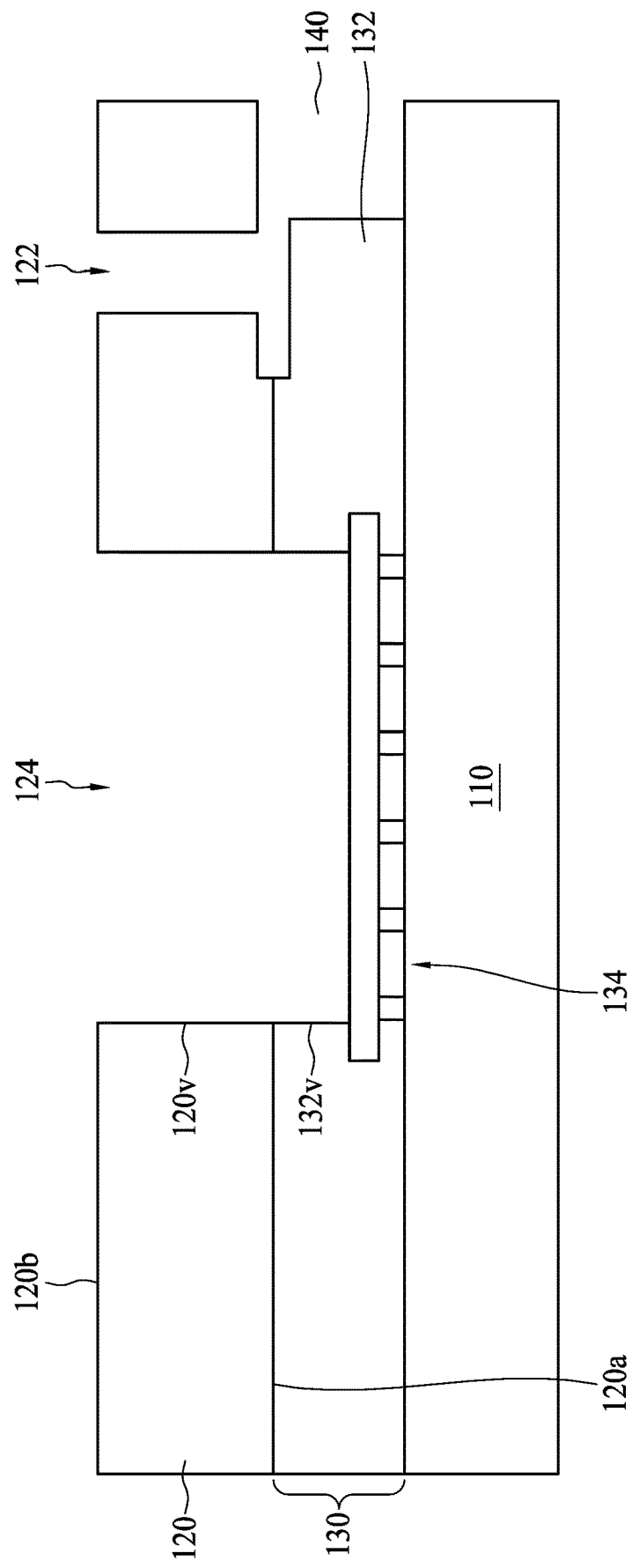

Referring to FIG. 7D, in operation 12, a vent hole 122 is formed in the second substrate 120 to couple to the cavity 140, and a via opening 124 is formed in the second substrate 120 to expose the conductive layer 134. A diameter of the vent hole 122 can be between approximately 0.05 μm and approximately 2 μm, but the disclosure is not limited thereto. A diameter of the via opening 124 can be between approximately 5 μm and approximately 15 μm, but the disclosure is not limited thereto. The vent hole 122 penetrates the second substrate 120 from the second surface 120b to the first surface 120a and extends to the cavity 140. Therefore, the vent hole 122 has two end openings, one end opening in the first surface 120a and the other end opening in the second surface 120b of the second substrate 120, and the second substrate 122 serves as sidewalls of the vent hole 122. In some embodiments, the forming of the vent hole 122 may break the hermetic seal of the cavity 140. The via opening 124 penetrates the second substrate 120 from the second surface 120b to the first surface 120a. Further, the via opening 124 couples to the opening 137 and thus the conductive layer 134 is exposed through a bottom of the via opening 124. Therefore, the conductive layer 134 serves as a bottom surface of the via opening 124, and the second substrate 120 and a portion of the dielectric layer 132 serve as sidewalls of the via opening 124.

In some embodiments, a vertical surface 120v of the second substrate 120 exposed through the via opening 124 and a vertical surface 132v of the dielectric layer 132 exposed through the via opening 124 serve as the sidewalls of the via opening 124. In some embodiments, the vertical surface 120v of the second substrate 120 and the vertical surface 132v of the dielectric layer 132 are coupled to each other to form a straight line, as shown in FIG. 7D.

Figure 7E:
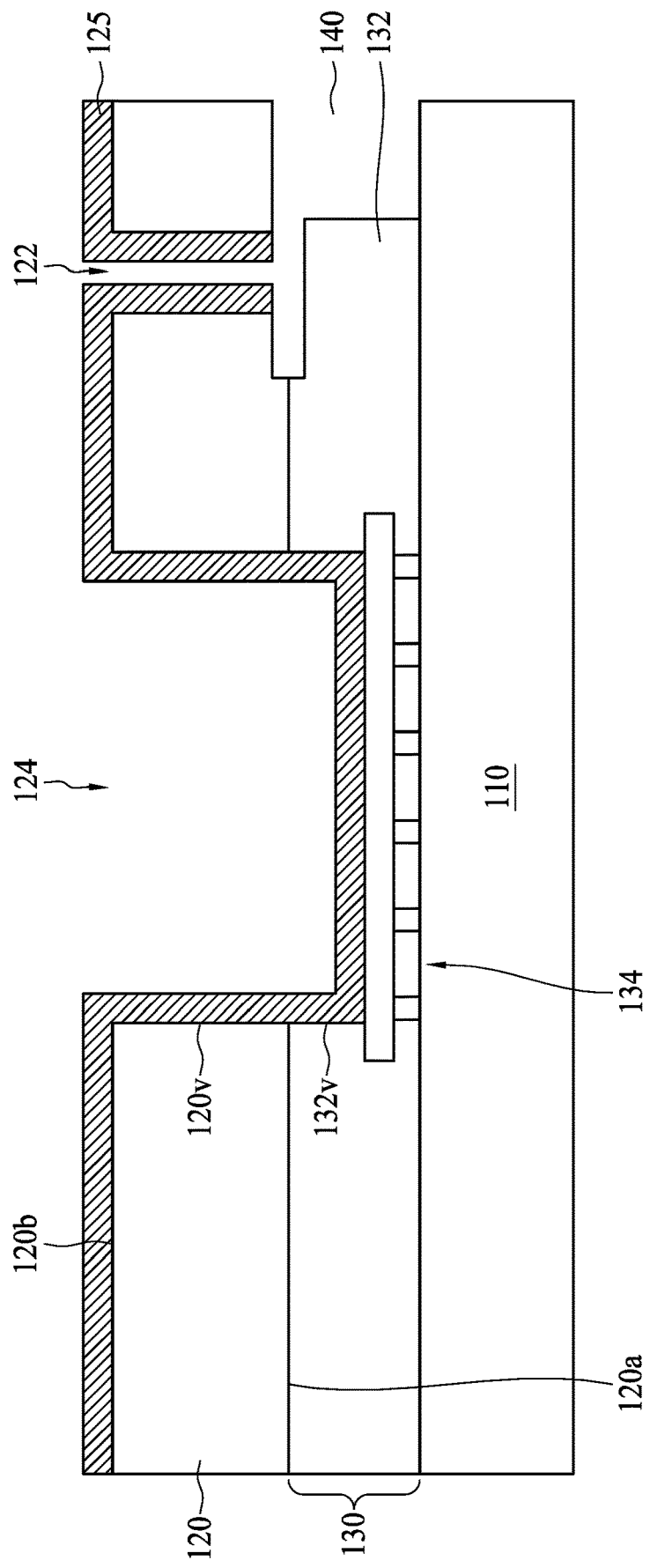

Referring to FIG. 7E, in operation 13, an insulating layer 125 is formed over the second substrate 120 and the conductive layer 134. Further, the insulating layer 125 covers the second surface 120b (the exterior surface) of the second substrate 120, the vertical surface 120v of the second substrate 120 exposed though the via opening 124, the vertical surface 132v of the dielectric layer 132 exposed through the via opening, the sidewalls of the vent hole 122, and the conductive layer 134 exposed through the via opening 124. In some embodiments, the insulating layer 125 can include SiO, SiN or SiON, but the disclosure is not limited thereto. In some embodiments, a thickness of the insulating layer 125 is greater than approximately 0.5 μm, but the disclosure is not limited thereto. In some embodiments, a thickness of the insulating layer 125 is between approximately 0.5 μm and approximately 2 μm, but the disclosure is not limited thereto.

Figure 7F:
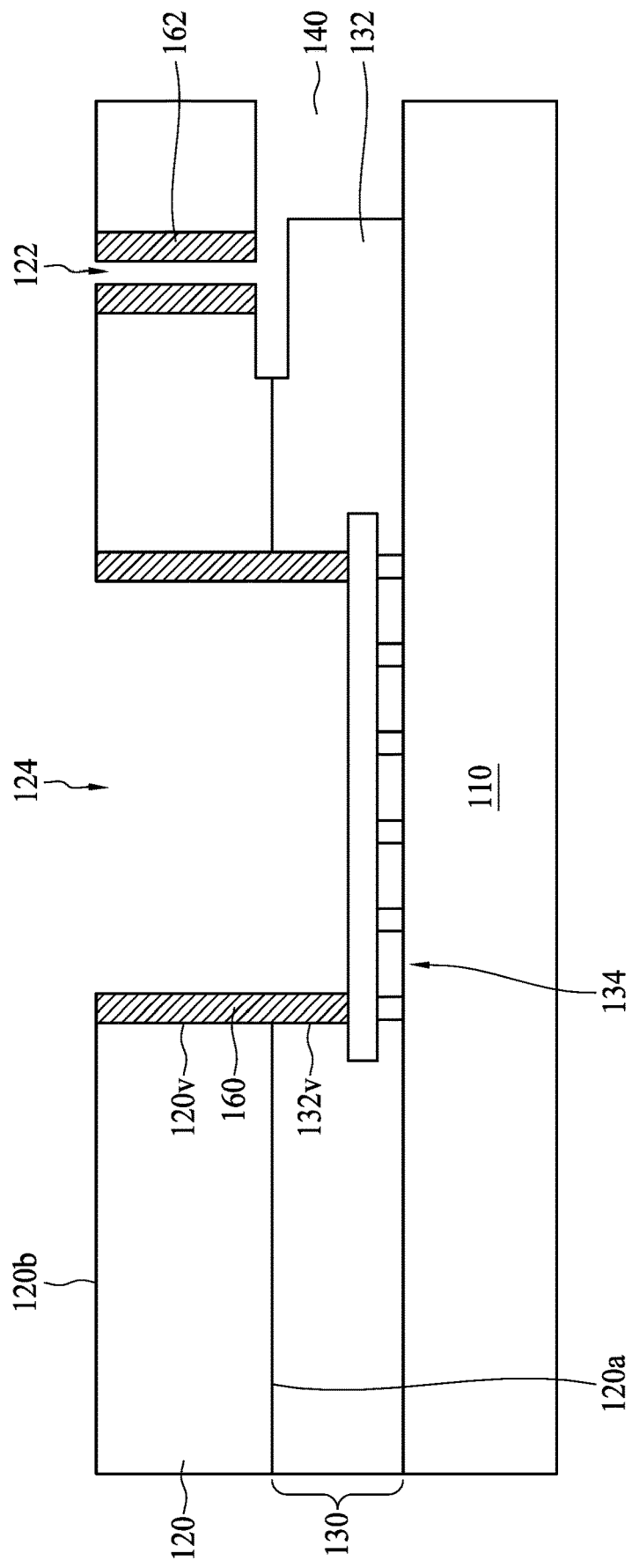

Referring to FIG. 7F, in operation 14, portions of the insulating layer 125 are removed to form a first buffer layer 160 over the sidewalk of the via opening 124 and a second buffer layer 162 over sidewalls of the vent hole 122. In other words, the first buffer layer 160 and the second buffer layer 162 include a same material. In some embodiments, the first buffer layer 160 and the second buffer layer 162 can include a same thickness, but the disclosure is not limited thereto. In some embodiments, the removal of the portions of the insulating layer 125 includes an etching back operation. Accordingly, the portions of the insulating layer 125 that were previously formed over the second surface 120b of the second substrate 120 and over the conductive layer 134 are now removed. Significantly, the vertical surface 120 of the second substrate 120 and the vertical surface 132v of the dielectric layer 132 are still covered by the first buffer layer 160, as shown in FIG. 7F.

Figure 7G:
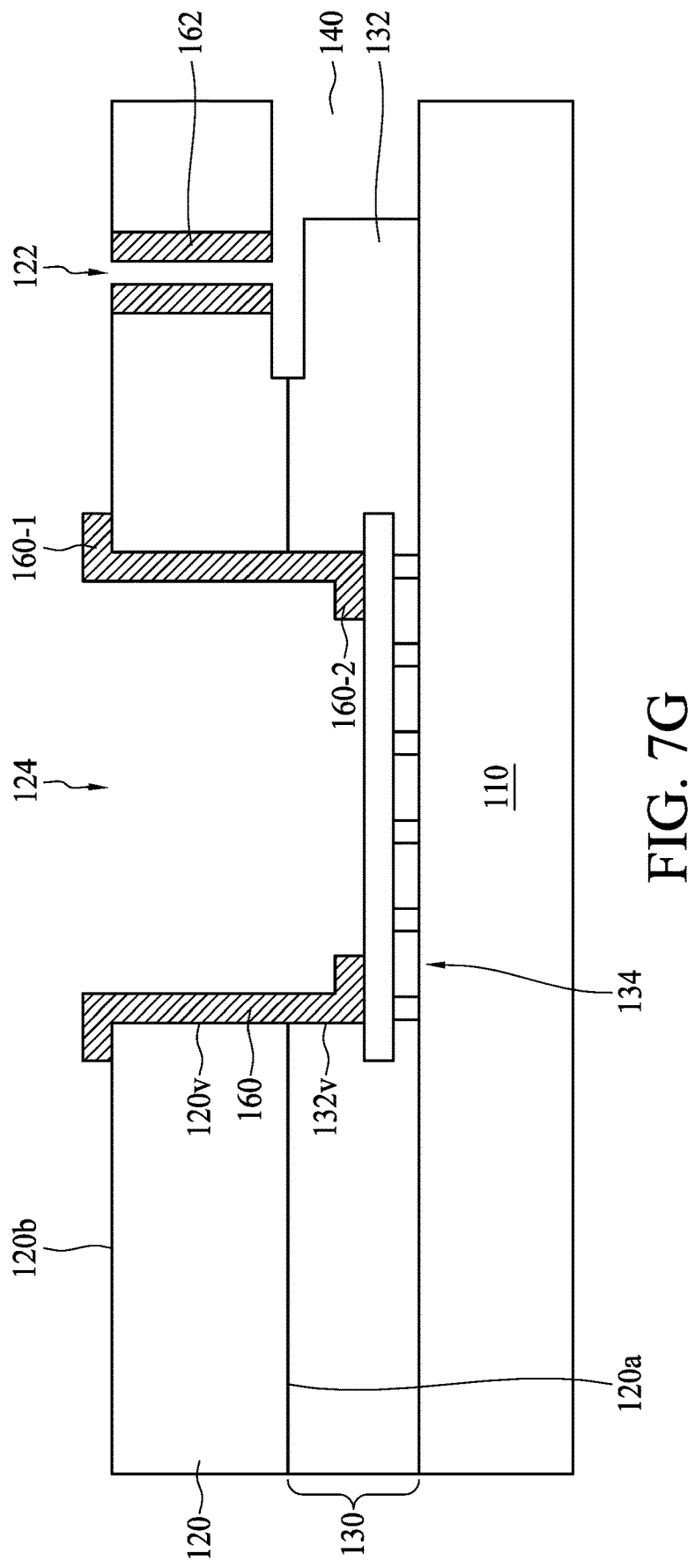

Referring to FIG. 7G, in some embodiments, portions of the insulating layer 125 can be removed by a patterning operation. For example, a hard mask and a patterned photoresist layer (both not shown) can be formed over the insulating layer 125. The hard mask is subsequently patterned through the patterned photoresist to form a patterned hard mask, and an etching operation can be performed to remove the portions of the insulating layer 125 to form the first buffer layer 160 and the second buffer layer 162 through the patterned hard mask. In some embodiments, the configuration of the first buffer layer 160 and the second buffer layer 162 can be defined by the patterned hard mask. For example, the first buffer layer 160 can further include a first portion 160-1 and a second portion 160-2 can be formed by the patterning operation. In some embodiments, the first portion 160-1 covers a portion of the second surface 120b of the second substrate 120 and the second portion 160-2 covers a portion of the conductive layer 134, as shown in FIG. 7G, but the disclosure is not limited thereto. Accordingly, by forming the first portion 160-1 and the second portion 160-2, not only are the sidewalls of the via opening 124 covered, but also corners, such as a corner formed by the second surface 120b and the vertical surface 120v of the second substrate 120, and a corner formed by the vertical surface 132v of the dielectric layer 132 and the conductive layer 134, are covered.

Figure 7H:
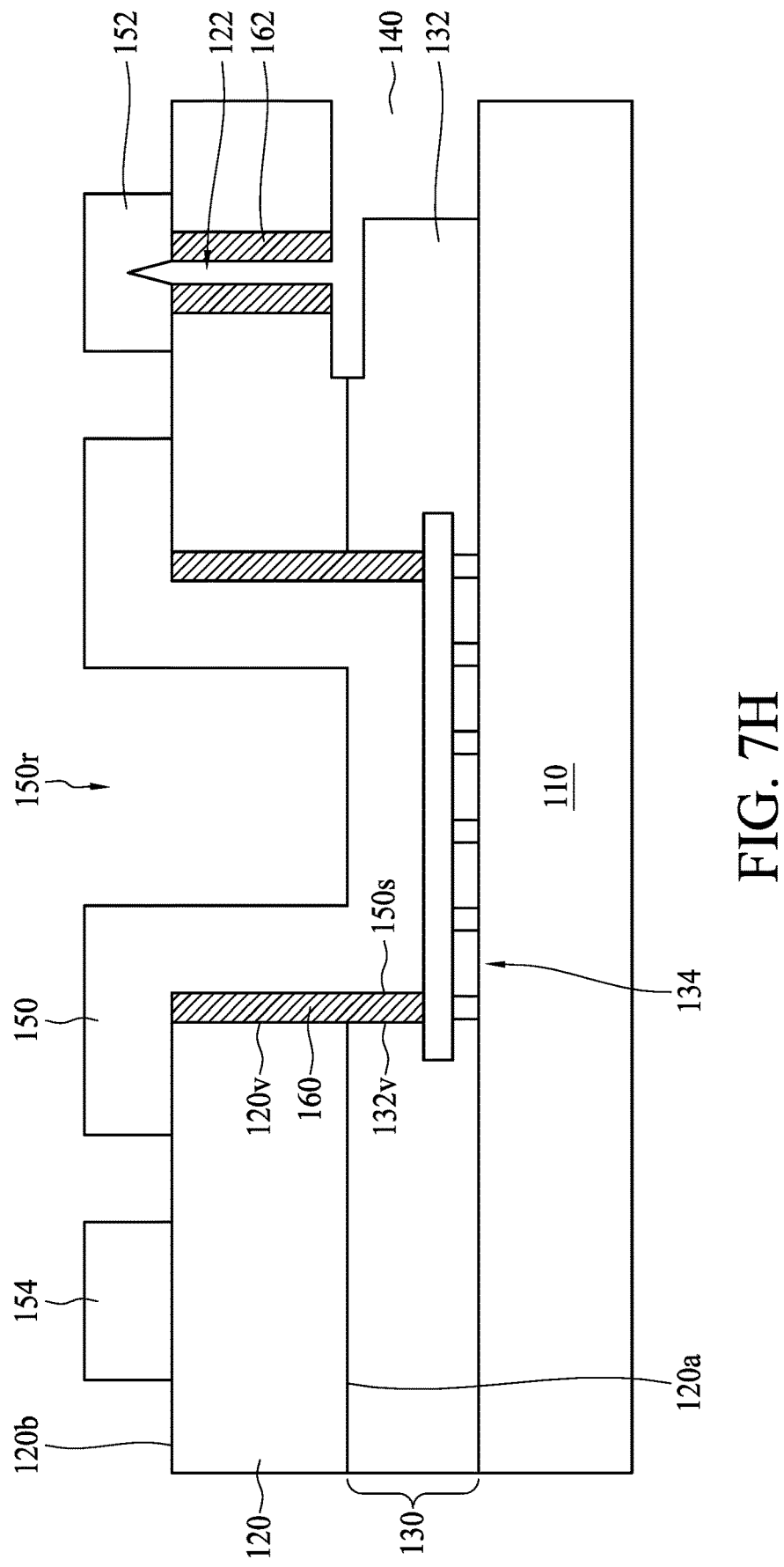

Referring to FIG. 7H, in operation 15, a connecting structure 150, a sealing structure 152 and a bonding structure 154 can be simultaneously formed over the second surface 120b of the second substrate 120. In some embodiments, the connecting structure 150, the sealing structure 152 and the bonding structure 154 can include a same material, but the disclosure is not limited thereto. The connecting structure 150 is formed in the via opening 124. Further, the connecting structure 150 is conformally formed in the via opening 124 and thus a recessed portion 150r is formed in an exterior surface of the connecting structure 150, but the disclosure is not limited thereto. The sealing structure 152 is formed over an opening of the vent hole 122 over the second surface 120b of the second substrate 120. Further, the sealing structure 152 seals the vent hole 122 from the second surface 120b of the second substrate 120. The bonding structure 154 can be electrically coupled to a connecting structure 150, though not shown. In some embodiments, the bonding structure 154 can be electrically connected to the first substrate 110 through the connecting structure 150 and the interconnection structure 130.

Significantly, the connecting structure 150, the sealing structure 152 and the bonding structure 154 can include a same thickness. For example but not limited thereto, the thickness of the connecting structure 150, the sealing structure 152 and the bonding structure 154 can be greater than 3 μm, but the disclosure is not limited thereto. It should be appreciated that the thickness must be greater than 3 μm, so that the vent hole 122 can be hermetically sealed.

However, with such thickness, the connecting structure 150 may induce thermal stress because a CTE of the connecting structure 150 is different from a CTE of the dielectric layer 132. The thermal stress, usually a tensile stress, may cause a crack in the dielectric layer 132. According to some embodiments of the present disclosure, the first buffer layer 160 is formed over the vertical surface 132v of the dielectric layer 132 as shown in FIG. 7H, and the corner formed by the dielectric layer 132 and the conductive layer 134 as shown in FIG. 7G. More importantly, the first buffer layer 160 provides a compressive stress that is opposite to the tensile stress from the connecting structure 150. Consequently, the thermal stress caused by the connecting structure 150 is balanced, and thus the crack issue is mitigated. In some embodiments, the thermal stress can be reduced to approximately 50%, but the disclosure is not limited thereto.

Figure 7I:
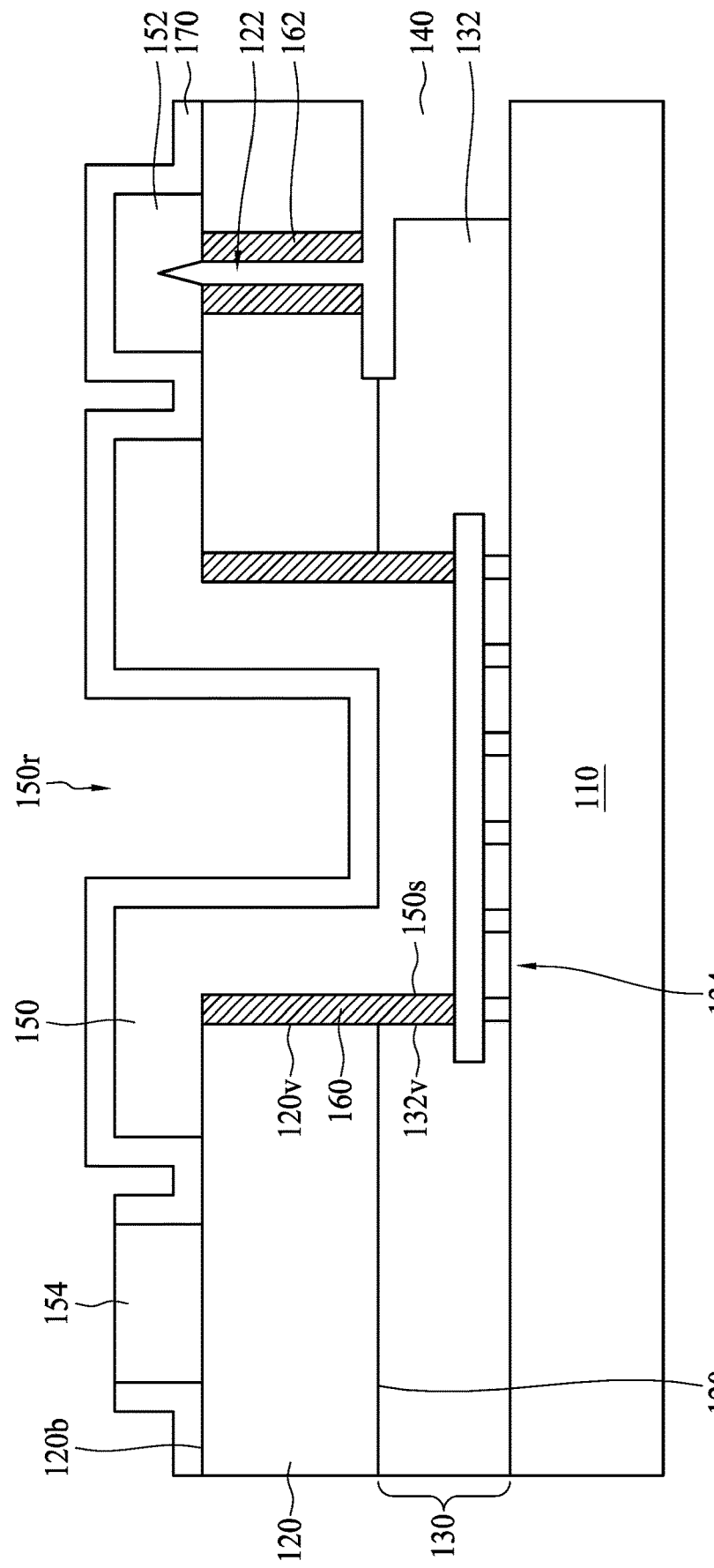

Referring to FIG. 7I, in some embodiments, a dielectric layer 170 is formed over the second substrate 120, the connecting structure 150 and the sealing structure 152. In some embodiments, the dielectric layer 170 can include Sill, SiN, SiON or the like. As shown in FIG. 7I, the dielectric layer coves the second surface 120b of the second substrate 120, exterior surfaces of the connecting structure 150 and exterior surfaces of the sealing layer 152. Significantly, the dielectric layer 170 covers sidewalls of the bonding structure 154 but exposes a top surface of the bonding structure 154 for providing a bonding surface for an external source.

FIGS. 8A through 8E illustrate partial sectional views of a semiconductor device at various fabrication stages constructed according to aspects of the present disclosure in one or more embodiments. In some embodiments, a method of forming a semiconductor device 10 can be provided to form the semiconductor device shown in FIGS. 8A through 8E, but the disclosure is not limited thereto. It should be understood that same elements in FIGS. 8A through 87 and 7A through 7I are depicted by same numerals, and repetitive details may be omitted in the interest of brevity. Significantly, although FIGS. 7A through 7I illustrate the portion A shown in FIG. 1, the remaining portions of the semiconductor device can be easily understood according to the method for manufacturing the semiconductor device in accordance with some embodiments of the present disclosure.

Figure 8A:
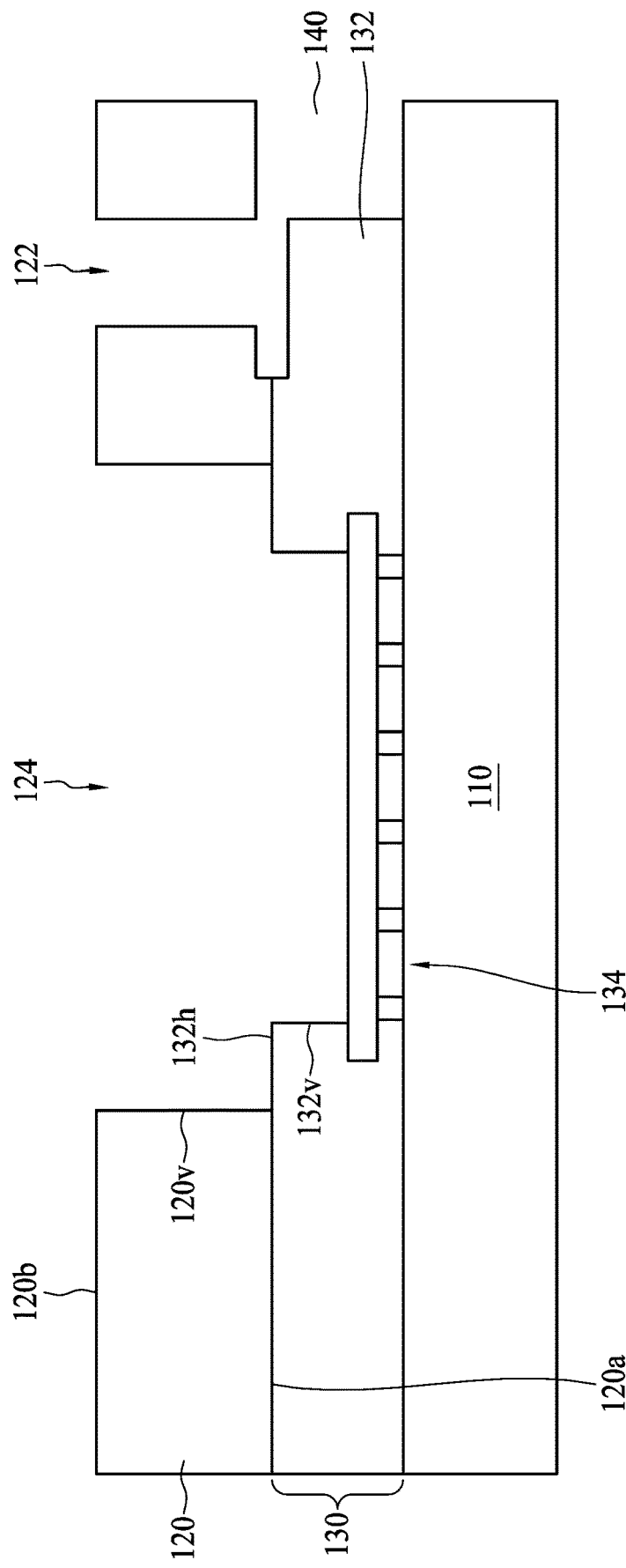
FIGS. 8A through 8E illustrate sectional views of a semiconductor device at various fabrication stages constructed according to aspects of the present disclosure in one or more embodiments.

Referring to FIG. 8A, a first substrate 110 is provided or received in operation 11. The first substrate 110 is bonded to a second substrate 120 by a dielectric layer 132. Further, a conductive layer 134 is disposed in the dielectric layer 132. An opening (not shown) and a cavity 140 can be formed by etching portions of the dielectric layer 132 of the interconnection structure 130. Further, the cavity 140 is sealed and formed between the first substrate 110, the second substrate 120 and the dielectric layer 132. The second substrate 120 includes a first surface 120a facing the first substrate 110 and a second surface 120h opposite to the first surface 120a. Additionally, the second surface 120b can be referred to as an exterior surface, but the disclosure is not limited thereto. As mentioned above, the cavity 140 is hermetically sealed with the first substrate 110 serving as a bottom surface, the first surface 120a of the second substrate 120 serving as a top surface and the dielectric layer 132 serves as sidewalls. In some embodiments, the cavity 140 is in vacuum, but the disclosure is not limited thereto. In some embodiments, a thickness of the second substrate 120 can be reduced if required.

Still referring to FIG. 8A, in operation 12, a vent hole 122 is formed in the second substrate 120 to couple to the cavity 140 and a via opening 124 is formed in the second substrate 120 to couple to the opening and expose the conductive layer 134, A diameter of the vent hole 122 can be between approximately 0.05 μm and approximately 2 μm, but the disclosure is not limited thereto. A diameter of the via opening 124 can be greater than a diameter of the opening 137, but the disclosure is not limited thereto. The vent hole 122 penetrates the second substrate 120 from the second surface 120h to the first surface 120a and extends to the cavity 140. Therefore, the vent hole 122 has two end openings, one end opening in the first surface 120a and another end opening in the second surface 120b of the second substrate 120, and the second substrate 122 serves as sidewalls of the vent hole 122. In some embodiments, the forming of the vent hole 122 may break the hermetic seal of the cavity 140.

As shown in FIG. 8A, the via opening 124 penetrates the second substrate 120 from the second surface 120b to the first surface 120a. Further, the via opening 124 couples to the opening and thus the conductive layer 134 is exposed through a bottom of the via opening 124. Therefore, the conductive layer 134 serves as a bottom surface of the via opening 124. In some embodiments, a vertical surface 120v of the second substrate 120 exposed through the via opening 124 and a vertical surface 132v of the dielectric layer 132 exposed through the via opening 124 serve as the sidewalk of the via opening 124. In some embodiments, the vertical surface 120v of the second substrate 120 and the vertical surface 132v of the dielectric layer 132 are separated from each other by a horizontal surface 132h of the dielectric layer 132. In some embodiments, the horizontal surface 132h of the dielectric layer 132 is substantially parallel with the first surface 120a or the second surface 120b of the second substrate 120, but the disclosure is not limited thereto.

Figure 8B:
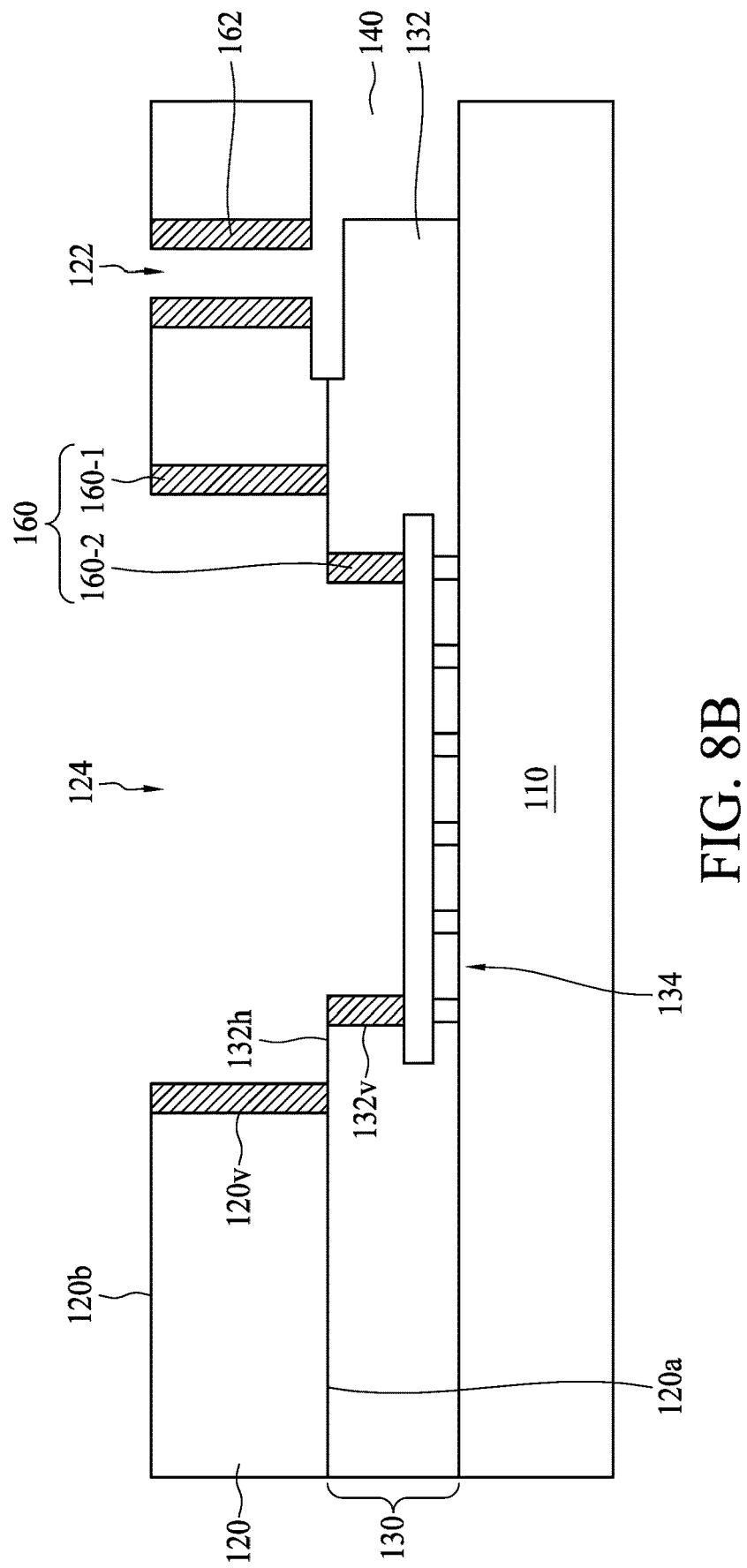

Referring to FIG. 8B, in operation 13, an insulating layer (not shown) is formed over the second substrate 120 and the conductive layer 134. In operation 14, portions of the insulating layer are removed to form a first buffer layer 160 over the sidewalls of the via opening 124 and a second buffer layer 162 over sidewalls of the vent hole 122. In some embodiments, the removal of the portions of the insulating layer includes an etching back operation. Accordingly, the portions of the insulating layer that were previously formed over the second surface 120b of the second substrate 120, over the horizontal surface 132h of the dielectric layer 132 and over the conductive layer 134 are now removed. Significantly, the vertical surface 120v of the second substrate 120 and the vertical surface 132v of the dielectric layer 132 are still covered by the first buffer layer 160, as shown in FIG. 8B.

Figure 8C:
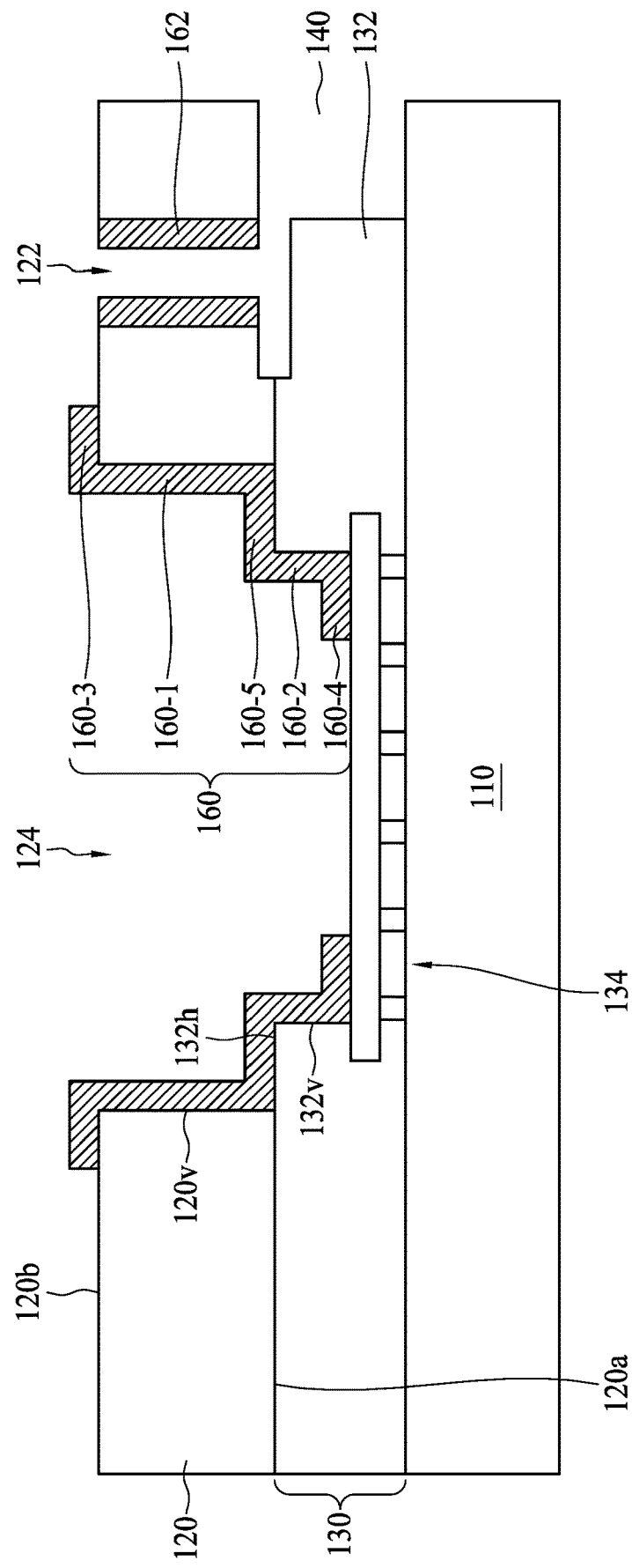

Referring to FIG. 8C, in some embodiments, portions of the insulating layer can be removed by a patterning operation. In some embodiments, the configuration of the first buffer layer 160 and the second buffer layer 162 can be defined by the patterning operation. For example, the first buffer layer 160 can include a first portion 160-1 covering the vertical surface 120v of the second substrate 120, a second portion 160-2 covering the vertical surface 132v of the dielectric layer 132, a third portion 160-3 covering a portion of the second surface 120b of the second surface, a fourth portion 160-4 covering a portion of the conductive layer 134, and a fifth portion 160-5 covering the horizontal surface 132h of the dielectric layer. As shown in FIG. 8C, the first portion 160-1 to the fifth portion 160-5 are coupled to each other to form a staggered shape. Accordingly, by forming the third portion 160-3, the fourth portion 160-4 and the fifth portion 160-5, not only are the sidewalk of the via opening 124 covered, but also corners, such as a corner formed by the second surface 120b, a corner formed by the vertical surface 120v of the second substrate 120 and the horizontal surface 132h of the dielectric layer 132, and a corner formed by the vertical surface 132v of the dielectric layer 132 and the conductive layer 134, are covered.

Figure 8D:
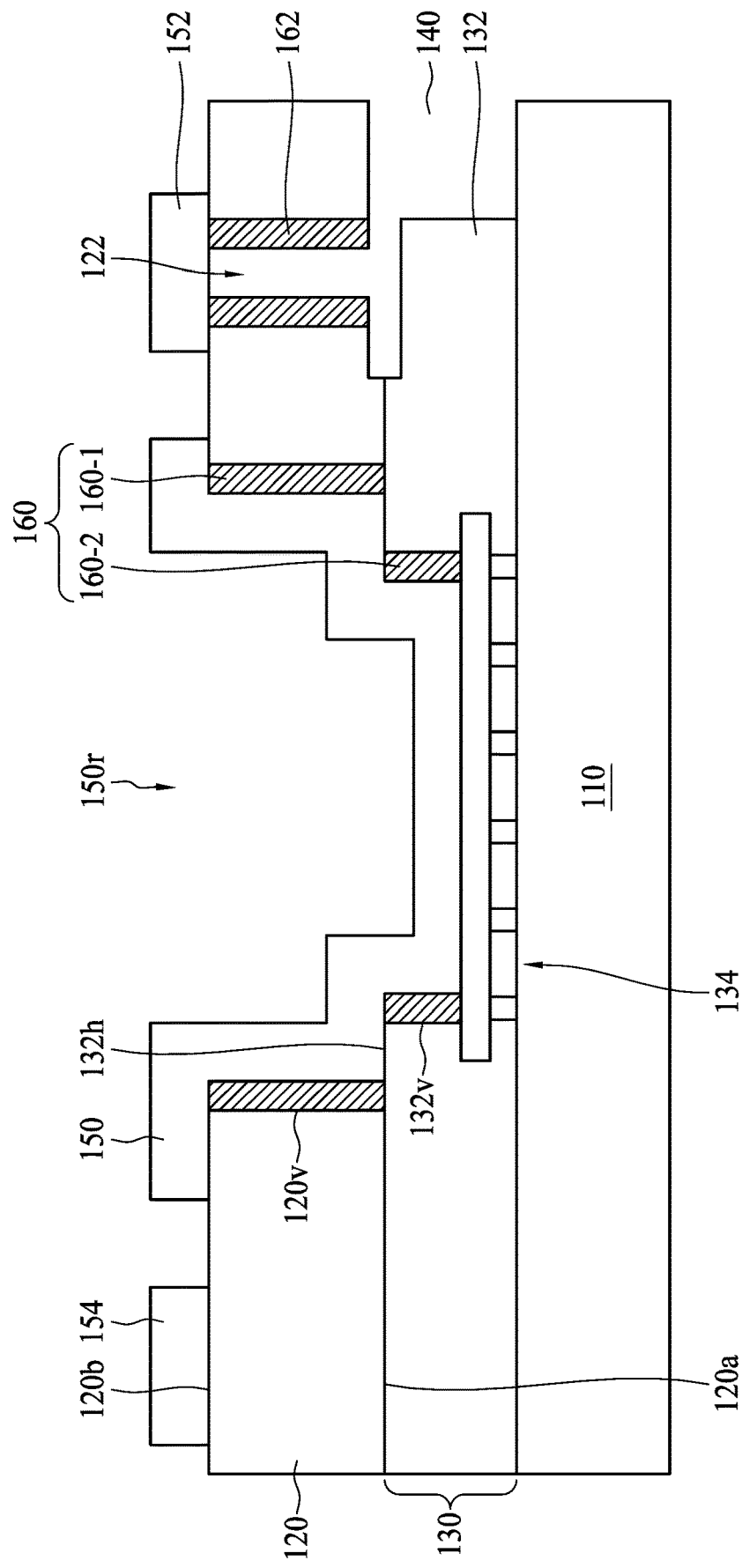

Referring to FIG. 8D, in operation 15, a connecting structure 150, a sealing structure 152 and a bonding structure 154 can be simultaneously formed over the second surface 120b of the second substrate 120. The connecting structure 150 is formed in the via opening 124. Further, the connecting structure 150 is conformally formed in the via opening 124 and thus a recessed portion 150r is firmed in an exterior surface of the connecting structure 150, but the disclosure is not limited thereto. The sealing structure 152 is formed over an opening of the vent hole 122 over the second surface 120b of the second substrate 120. Further, the sealing structure 152 seals the vent hole 122 from the second surface 120b of the second substrate 120. The bonding structure 154 can be electrically coupled to a connecting structure 150, though not shown. In some embodiments, the bonding structure 154 can be electrically connected to the first substrate 110 through the connecting structure 150 and the interconnection structure 130.

As mentioned above, the connecting structure 150 may induce thermal stress because a CTE of the connecting structure 150 is different from a CTE of the dielectric layer 132. The thermal stress, usually a tensile stress, may cause a crack in the dielectric layer 132. According to some embodiments, of the present disclosure, the first buffer layer 160 is formed over the vertical surface 132v of the dielectric layer 132 as shown in FIG. 8B, and the corner formed by the dielectric layer 132 and the conductive layer 134 as shown in FIG. 8C. More importantly, the first buffer layer 160 provides a compressive stress that is opposite to the tensile stress from the connecting structure 150. Consequently, the thermal stress caused by the connecting structure 150 is balanced, and thus the crack issue is mitigated. In some embodiments, the thermal stress can be reduced to approximately 50%, but the disclosure is not limited thereto.

Figure 8E:
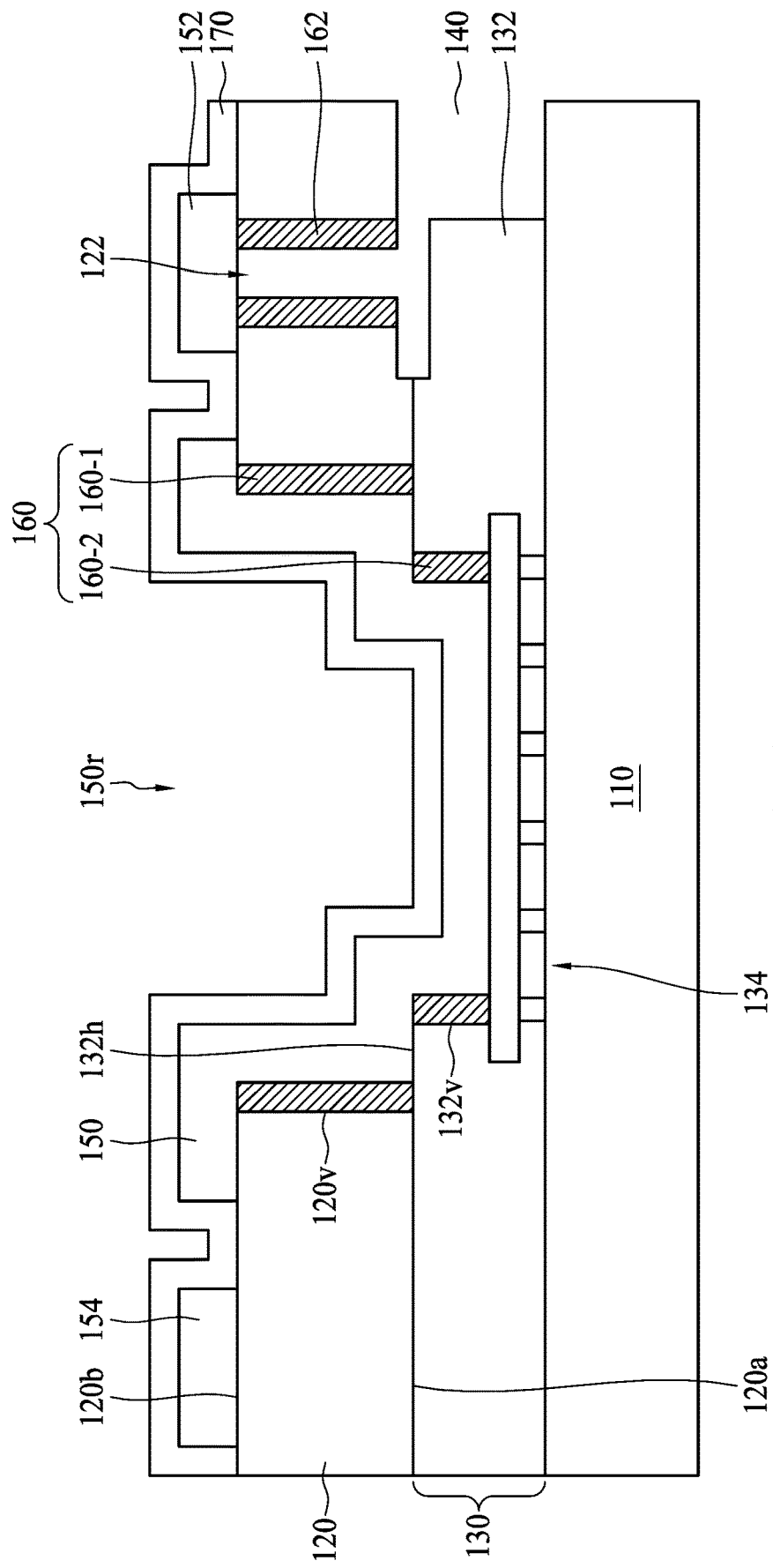

Referring to FIG. 8E, in some embodiments, a dielectric layer 170 is formed over the second substrate 120, the connecting structure 150 and the sealing structure 152. In some embodiments, the dielectric layer 170 can include SiO, SiN, SiON or the like. As shown in FIG. 8E, the dielectric layer coves the second surface 120b of the second substrate 120, exterior surfaces of the connecting structure 150 and exterior surfaces of the sealing layer 152. Significantly, the dielectric layer 170 covers sidewalls of the bonding structure 154 but exposes a top surface of the bonding structure 154 for providing a bonding surface for an external source.

In the present disclosure, by forming the buffer layer over the dielectric surface and dielectric corner, a compressive stress that is opposite to the tensile stress from the connecting structure is generated. Consequently, the tensile stress may be balanced by the buffer layer, and thus the crack issue in the dielectric layer may be mitigated.

In some embodiments, a method for forming a semiconductor device is provided. The method includes receiving a first bonded to a second substrate by a dielectric layer, wherein a conductive layer is disposed in the dielectric layer and a cavity is formed between the first substrate, the second substrate and the dielectric layer; forming a via opening in the second substrate to expose the conductive layer and a vent hole in the substrate to couple to the cavity; forming a first buffer layer covering sidewalls of the via opening and a second buffer layer covering sidewalls of the vent hole; and forming a connecting structure in the via opening and a sealing structure to seal the vent hole.

In some embodiments, a method for manufacturing a semiconductor device is provided. The method includes following operations. A first substrate is received. The first substrate includes an interconnection structure disposed thereon. The interconnection structure includes a dielectric layer and at least a conductive layer disposed in the dielectric layer. A first opening and a second opening are formed in the dielectric layer. The first opening exposes the first substrate, and the second opening exposes the conductive layer. A second substrate is bonded to the first substrate to form a cavity between the first substrate, the dielectric layer and the second substrate. A via opening is formed in the second substrate to expose the conductive layer, and a vent hole is formed in the second substrate to couple to the cavity. A first buffer layer is formed to cover sidewalls of the via opening, and a second buffer layer is formed to cover sidewalls of the vent hole. A connecting structure is formed in the via opening and a sealing structure 152 is formed to seal the vent hole.

In some embodiments, a method for manufacturing a semiconductor device is provided. The method includes following operations. A first substrate bonded to a second substrate by a dielectric layer is received. A conductive layer is disposed in the dielectric layer. A cavity is formed between the first substrate, the second substrate and the dielectric layer. A via opening is formed in the second substrate to expose the conductive layer. The via opening includes a first sidewall formed by the dielectric layer and a second sidewall formed by the second substrate. The first sidewall and the second sidewall are misaligned. A first buffer layer is formed to cover the first sidewall and the second sidewall of the via opening. A connecting structure is formed in the via opening, and a sealing structure is formed to seal the vent hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   receiving a first substrate bonded to a second substrate by a dielectric layer, wherein a conductive layer is disposed in the dielectric layer and a cavity is formed between the first substrate, the second substrate and the dielectric layer;
   forming a via opening in the second substrate to expose the conductive layer and a vent hole in the second substrate to couple to the cavity;
   forming a first buffer layer covering sidewalk of the via opening and a second buffer layer covering sidewalk of the vent hole; and
   forming a connecting structure in the via opening and a sealing structure to seal the vent hole.

2. The method of claim 1, wherein the forming of the first buffer layer and the second buffer layer further comprises:
   forming an insulating layer over the second substrate and the conductive layer, wherein the insulating layer covers an exterior surface of the second substrate, the conductive layer exposed through the via opening and the sidewalk of the vent hole; and
   removing portions of the insulating layer to form the first buffer layer and the second buffer layer.

3. The method of claim 1, further comprising forming a bonding structure simultaneously with the forming of the connecting structure and the sealing layer.

4. The method of claim 1, further comprising forming a dielectric layer over the second substrate, the connecting structure and the sealing structure.

5. The method of claim 1, wherein the first buffer layer is in contact with a portion of the dielectric layer and a portion of the second substrate.

6. A method for manufacturing a semiconductor device, comprising:
   receiving a first substrate comprising an interconnection structure disposed thereon, wherein the interconnection structure comprises a dielectric layer and at least a conductive layer disposed in the dielectric layer;
   forming a first opening and a second opening in the dielectric layer, wherein the first opening exposes the first substrate, and the second opening exposes the conductive layer;
   bonding a second substrate to the first substrate to form a cavity between the first substrate, the dielectric layer and the second substrate;
   forming a via opening in the second substrate to expose the conductive layer and a vent hole in the second substrate to couple to the cavity;
   forming a first buffer layer covering sidewalk of the via opening and a second buffer layer covering sidewalk of the vent hole; and
   forming a connecting structure in the via opening and a sealing structure to seal the vent hole.

7. The method of claim 6, wherein the forming of the first buffer layer and the second buffer layer further comprises:
   forming an insulating layer over the second substrate and the conductive layer, wherein the insulating layer covers an exterior surface of the second substrate, the conductive layer exposed through the via opening and the sidewalk of the vent hole; and
   removing portions of the insulating layer to form the first buffer layer and the second buffer layer.

8. The method of claim 7, wherein the first buffer layer covers a portion of the exterior surface of the second substrate.

9. The method of claim 6, further comprising forming a bonding structure simultaneously with the forming of the connecting structure and the sealing layer.

10. The method of claim 9, wherein a thickness of the bonding structure and a thickness of the sealing layer are the same.

11. The method of claim 6, further comprising forming a dielectric layer over the second substrate, the connecting structure and the sealing structure.

12. A method for manufacturing a semiconductor device comprising:
   receiving a first substrate bonded to a second substrate by a dielectric layer, wherein a conductive layer is disposed in the dielectric layer and a cavity is formed between the first substrate, the second substrate and the dielectric layer;
   forming a via opening in the second substrate to expose the conductive layer, wherein the via opening comprises a first sidewall formed by the dielectric layer and a second sidewall formed by the second substrate, and the first sidewall and the second sidewall are misaligned;

forming a first buffer layer covering the first sidewall and the second sidewall of the via opening; and forming a connecting structure in the via opening and a sealing structure to seal the vent hole.

13. The method of claim 12, further comprising forming a vent hole in the second substrate to couple to the cavity.

14. The method of claim 13, further comprising forming a second buffer layer covering a sidewall of the vent hole.

15. The method of claim 12, wherein the forming of the first buffer layer further comprises:

forming an insulating layer over the second substrate and the conductive layer, wherein the insulating layer covers an exterior surface of the second substrate and the conductive layer exposed through the via opening; and removing portions of the insulating layer to form the first buffer layer.

16. The method of claim 12, further comprising forming a bonding structure simultaneously with the forming of the connecting structure and the sealing layer.

17. The method of claim 12, further comprising forming a dielectric layer over the second substrate, the connecting structure and the sealing structure.

18. The method of claim 12, wherein a portion of a top surface of the dielectric layer is exposed through the via opening.

19. The method of claim 18, wherein the connecting structure is in contact with the exposed top surface of the dielectric layer.

20. The method of claim 18, wherein the first buffer layer covers and is in contact with the exposed top surface of the dielectric layer.

* * * * *